(12) United States Patent
Wei et al.

(10) Patent No.: US 11,716,846 B2
(45) Date of Patent: Aug. 1, 2023

(54) THREE-DIMENSIONAL MEMORY DEVICES HAVING THROUGH STAIR CONTACTS AND METHODS FOR FORMING THE SAME

(71) Applicant: YANGTZE MEMORY TECHNOLOGIES CO., LTD., Wuhan (CN)

(72) Inventors: Qinxiang Wei, Wuhan (CN); Jianhua Sun, Wuhan (CN); Ji Xia, Wuhan (CN)

(73) Assignee: YANGTZE MEMORY TECHNOLOGIES CO., LTD., Wuhan (CN)

( * ) Notice: Subject to any disclaimer, the term of this patent is extended or adjusted under 35 U.S.C. 154(b) by 187 days.

(21) Appl. No.: 17/097,635

(22) Filed: Nov. 13, 2020

(65) Prior Publication Data

US 2021/0082953 A1     Mar. 18, 2021

Related U.S. Application Data

(63) Continuation of application No. 16/292,268, filed on Mar. 4, 2019, now Pat. No. 10,847,539, which is a (Continued)

(51) Int. Cl.
     *H10B 43/27*      (2023.01)
     *H10B 43/35*      (2023.01)
(Continued)

(52) U.S. Cl.
     CPC ....... *H10B 43/27* (2023.02); *H01L 21/76802* (2013.01); *H01L 21/76877* (2013.01);
(Continued)

(58) Field of Classification Search
     CPC ........... H01L 27/11582; H01L 27/1157; H01L 27/11573; H01L 27/11565;
(Continued)

(56) References Cited

U.S. PATENT DOCUMENTS 9,087,790 B2    7/2015   Oh et al.
9,576,967 B1    2/2017   Kimura et al.
(Continued)

FOREIGN PATENT DOCUMENTS

CN      103904031 A     7/2014
CN      107658315 A     2/2018
(Continued)

OTHER PUBLICATIONS

Extended European Search Report issued in corresponding European Application No. 19907062 4, dated Apr. 4, 2022, 9 pages.

(Continued)

*Primary Examiner* — Calvin Y Choi
(74) *Attorney, Agent, or Firm* — Bayes PLLC

(57) ABSTRACT

Embodiments of three-dimensional (3D) memory devices having through stair contacts (TSCs) and methods for forming the same are disclosed. In an example, a 3D memory device includes a memory stack and a TSC. The memory stack includes a plurality of interleaved conductive layers and dielectric layers. Edges of the interleaved conductive layers and dielectric layers define a staircase structure on a side of the memory stack. The TSC extends vertically through the staircase structure of the memory stack. The TSC includes a conductor layer and a spacer circumscribing the conductor layer.

20 Claims, 17 Drawing Sheets

Related U.S. Application Data continuation of application No. PCT/CN2019/070009, filed on Jan. 2, 2019.

(51) Int. Cl.
*H10B 43/40* (2023.01)
*H01L 21/768* (2006.01)
*H01L 23/522* (2006.01)
*H01L 21/28* (2006.01)

(52) U.S. Cl.
CPC .... *H01L 23/5226* (2013.01); *H01L 29/40117* (2019.08); *H10B 43/35* (2023.02); *H10B 43/40* (2023.02)

(58) Field of Classification Search
CPC ......... H01L 27/11575; H01L 21/76802; H01L 21/76877; H01L 21/76805; H01L 21/76831; H01L 21/823475; H01L 23/5226; H01L 29/40117
See application file for complete search history.

(56) References Cited

U.S. PATENT DOCUMENTS

| | | |
|---|---|---|
| 9,589,978 B1 | 3/2017 | Yip |
| 9,659,956 B1 | 5/2017 | Pachamuthu et al. |
| 10,115,440 B2 | 10/2018 | Nguyen et al. |
| 10,593,624 B2 | 3/2020 | Thimmegowda et al. |
| 10,665,606 B2 | 5/2020 | Baek et al. |
| 2015/0035050 A1 | 2/2015 | Yeom et al. |
| 2017/0179026 A1 | 6/2017 | Toyama |
| 2017/0236746 A1* | 8/2017 | Yu ...................... H01L 27/1157 257/314 |
| 2017/0365613 A1 | 12/2017 | Gunji-Yoneoka et al. |
| 2018/0053780 A1* | 2/2018 | Oh ...................... H01L 29/7843 |
| 2018/0301374 A1 | 10/2018 | Masamori et al. |
| 2019/0088589 A1* | 3/2019 | Zhu ...................... H01L 23/522 |
| 2019/0252404 A1* | 8/2019 | Kaminaga ......... H01L 27/11565 |

FOREIGN PATENT DOCUMENTS

| | | |
|---|---|---|
| CN | 107658317 A | 2/2018 |
| CN | 108377660 A | 8/2018 |
| CN | 108431956 A | 8/2018 |
| CN | 108766971 A | 11/2018 |
| CN | 109075175 A | 12/2018 |
| KR | 20150015648 A | 2/2015 |
| WO | 2018194750 A1 | 10/2018 |

OTHER PUBLICATIONS

International Search Report issued in corresponding International Application No. PCT/CN2019/070009, dated Sep. 26, 2019, 5 pages.
Written Opinion of the International Searching Authority issued in corresponding International Application No. PCT/CN2019/070009, dated Sep. 26, 2019, 5 pages.

* cited by examiner

THREE-DIMENSIONAL MEMORY DEVICES HAVING THROUGH STAIR CONTACTS AND METHODS FOR FORMING THE SAME

CROSS-REFERENCE TO RELATED APPLICATIONS

This application is a continuation of U.S. application Ser. No. 16/292,268, filed on Mar. 4, 2019, entitled "THREE-DIMENSIONAL MEMORY DEVICES HAVING THROUGH STAIR CONTACTS AND METHODS FOR FORMING THE SAME," which is a continuation of International Application No. PCT/CN2019/070009, filed on Jan. 2, 2019, entitled "THREE-DIMENSIONAL MEMORY DEVICES HAVING THROUGH STAIR CONTACTS AND METHODS FOR FORMING THE SAME," both of which are hereby incorporated by reference in their entireties.

BACKGROUND

Embodiments of the present disclosure relate to three-dimensional (3D) memory devices and fabrication methods thereof.

Planar memory cells are scaled to smaller sizes by improving process technology, circuit design, programming algorithm, and fabrication process. However, as feature sizes of the memory cells approach a lower limit, planar process and fabrication techniques become challenging and costly. As a result, memory density for planar memory cells approaches an upper limit.

A 3D memory architecture can address the density limitation in planar memory cells. The 3D memory architecture includes a memory array and peripheral devices for controlling signals to and from the memory array.

SUMMARY

Embodiments of 3D memory devices and fabrication methods thereof are disclosed herein.

In one example, a method for forming a 3D memory device is provided. A dielectric stack including a plurality of interleaved dielectric layers and sacrificial layers is formed on a substrate. A staircase structure is formed on one side of the dielectric stack. A dummy hole extending vertically through the staircase structure and reaching the substrate is formed. A spacer having a hollow core is formed in the dummy hole. A TSC in contact with the substrate is formed by depositing a conductor layer in the hollow core of the spacer. The TSC extends vertically through the staircase structure.

In another example, a method for forming a 3D memory device is provided. A dielectric stack including a plurality of interleaved dielectric layers and sacrificial layers is formed on a substrate. A staircase structure is formed on one side of the dielectric stack. A dummy channel structure reaching the substrate is formed. The dummy channel structure extends vertically through the staircase structure. A spacer is formed by removing part of the dummy channel structure. The spacer has a hollow core. A TSC in contact with the substrate is formed by depositing a conductor layer in the hollow core of the spacer. The TSC extends vertically through the staircase structure.

In a different example, a 3D memory device is provided. The 3D memory device includes a substrate, a memory stack on the substrate including a plurality of interleaved conductor layers and dielectric layers, a staircase structure on one side of the memory stack, and a TSC extending vertically through the staircase structure of the memory stack. The TSC is in contact with the substrate.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1:
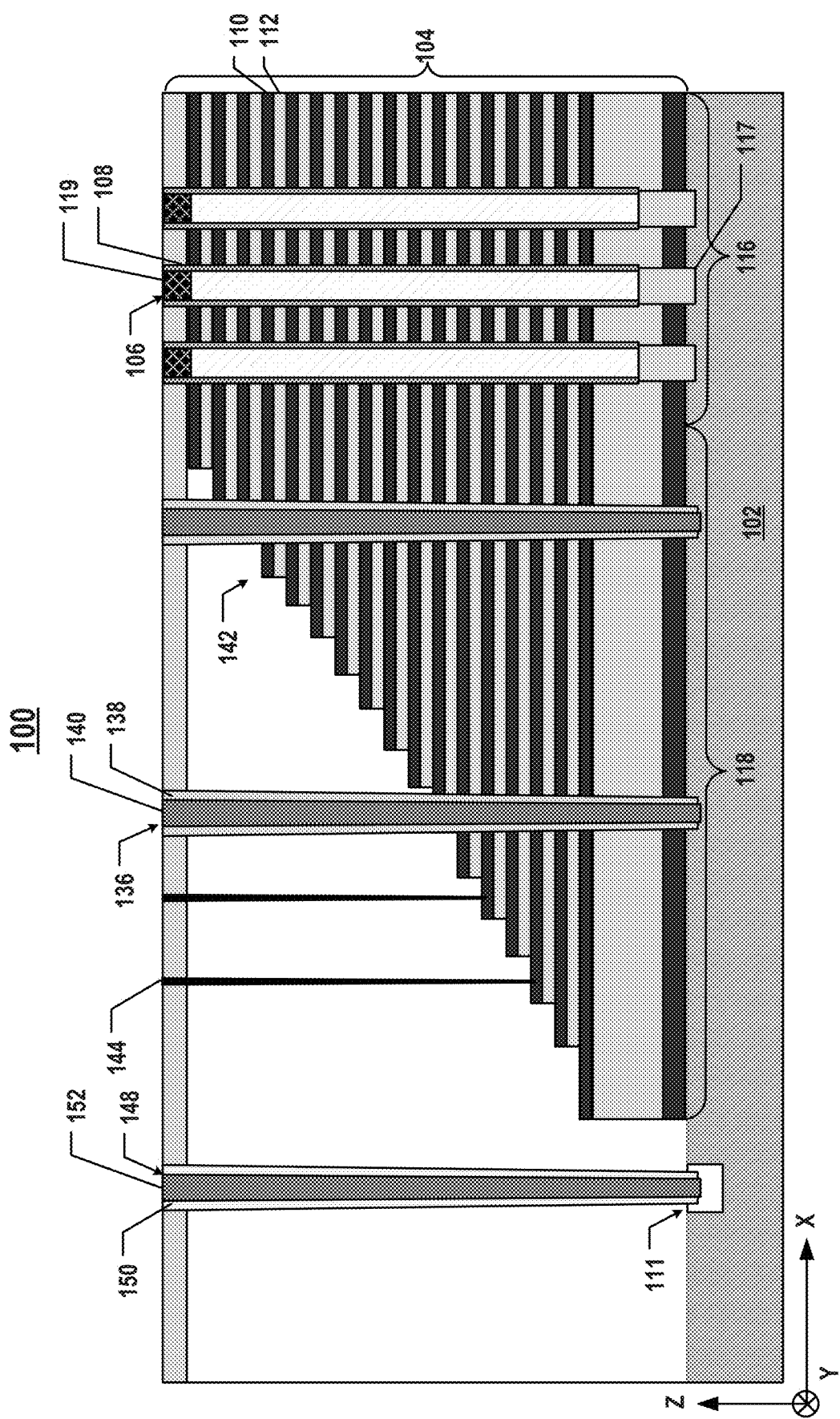
FIG. 1 illustrates a cross-section of an exemplary 3D memory device, according to some embodiments of the present disclosure.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to effect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations), and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend laterally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or via contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In some 3D memory devices, through stair contacts (TSCs) are used for providing vertical interconnects between a memory device and a peripheral device. In addition, dummy channel structures are used for providing structural support for the memory device. In existing fabrication processes, TSCs and dummy channel structures are formed in separate steps using different patterns. Because each pattern consumes its own share of real estate on a die, the available area on the die for other patterns becomes limited.

Figure 6:
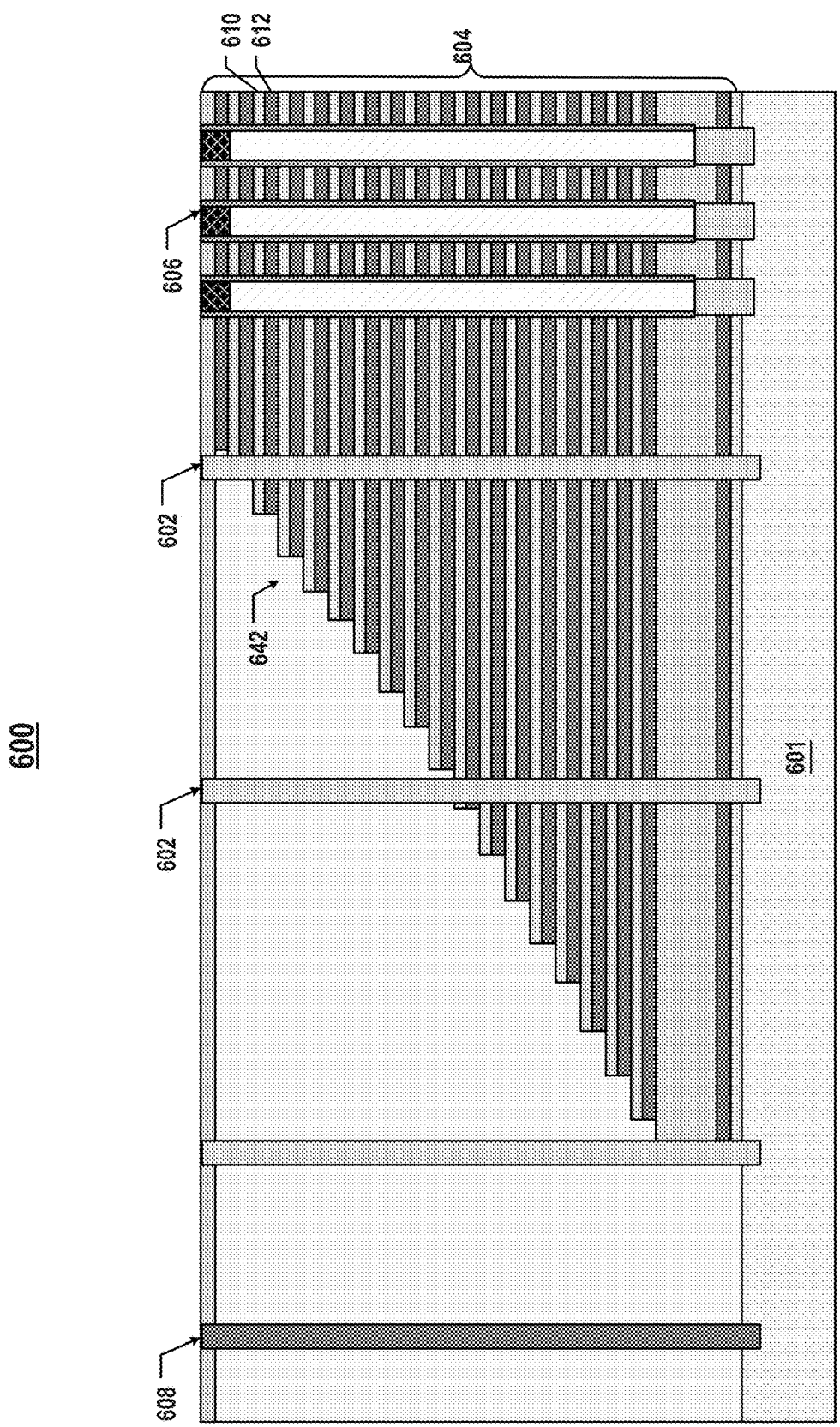
FIG. 6 illustrates related art using different patterns to form dummy channel structures and TSCs in separate fabrication steps.

FIG. 6 illustrates related art using different patterns to form dummy channel structures and TSCs in separate fabrication steps. As shown in FIG. 6, a memory device 600 includes a memory stack 604 above a substrate 601. Memory stack 604 may include an array of memory strings 606 and may include a staircase structure 642. An array of dummy channel structures 602 can be formed by first etching an array of dummy holes using a dummy pattern, and then filling the dummy holes with a dielectric layer to form the dummy channel structure 602. After forming dummy channel structure 602, sacrificial layer 610 that are initially formed as part of a dielectric stack including interleaved dielectric layer 612 and sacrificial layer 610 can be replaced by conductive layers to form word lines. After the word lines are formed, a TSC pattern can be used to etch an array of TSC holes, which are subsequently filled by a conductor layer to form TSC 608. The above-described fabrication processes utilize different patterns (a dummy channel structure pattern and a TSC pattern) to form dummy channel structure 602 and TSC 608, respectively, in separate fabrication steps.

Various embodiments in accordance with the present disclosure provide a 3D memory device having TSCs sharing the same pattern for forming the dummy channel structures, which improves the efficiency of die usage. For example, by combining two separate patterns into a single pattern, the available area on the die may be increased, allowing the placement of additional patterns. Moreover, various embodiments of methods for forming the 3D memory device disclosed herein can allow TSCs to be formed in the same fabrication process(es) for making other structures (e.g., peripheral contacts) and thus, further simplify the fabrication flow and reduce process cost.

FIG. 1 illustrates a cross-section of an exemplary 3D memory device 100, according to some embodiments of the present disclosure. 3D memory device 100 can include a substrate 102, which can include silicon (e.g., single crystalline silicon), silicon germanium (SiGe), gallium arsenide (GaAs), germanium (Ge), silicon on insulator (SOI), or any other suitable materials. In some embodiments, substrate 102 is a thinned substrate (e.g., a semiconductor layer), which was thinned from a normal thickness by grinding, wet/dry etching, chemical mechanical polishing (CMP), or any combination thereof.

3D memory device 100 can include a memory stack 104 above substrate 102. Memory stack 104 can be a stacked storage structure through which memory strings (e.g., NAND memory strings 106) are formed. In some embodiments, memory stack 104 includes a plurality of conductive/ dielectric layer pairs stacked vertically above substrate 102. Each conductive/dielectric layer pair can include a conductive layer 110 and a dielectric layer 112. That is, memory stack 104 can include interleaved conductive layers 110 and dielectric layers 112 stacked vertically. As shown in FIG. 1, each NAND memory string 106 extends vertically through interleaved conductive layers 110 and dielectric layers 112 in memory stack 104. In some embodiments, 3D memory device 100 is a NAND Flash memory device in which memory cells are provided at intersections of NAND memory strings 106 and conductive layers 110 (functioning as word lines) of 3D memory device 100. The number of conductive/dielectric layer pairs in memory stack 104 (e.g., 32, 64, 96, or 128) can set the number of memory cells in 3D memory device 100.

Conductive layers 110 can each have the same thickness or have different thicknesses. Similarly, dielectric layers 112 can each have the same thickness or have different thicknesses. Conductive layers 110 can include conductive materials including, but not limited to, tungsten (W), cobalt (Co), copper (Cu), aluminum (Al), polycrystalline silicon (polysilicon), doped silicon, silicides, or any combination thereof. Dielectric layers 112 can include dielectric materials including, but not limited to, silicon oxide, silicon nitride, silicon oxynitride, or any combination thereof. In some embodiments, conductive layers 110 include metals, such as W, and dielectric layers 112 include silicon oxide. It is understood that a silicon oxide film (not shown), such as an in-situ steam generation (ISSG) silicon oxide, can be formed between substrate 102 (e.g., a silicon substrate) and memory stack 104, according to some embodiments.

It is noted that x, y, and z axes are added to FIG. 1 to further illustrate the spatial relationship of the components in 3D memory device 100 (y-direction points into the page). The x-, y-, and z-directions are perpendicular to one another. Substrate 102 includes two lateral surfaces (e.g., a top surface and a bottom surface) extending laterally in the x-direction and y-direction (the lateral direction) in the x-y plane. As used herein, whether one component (e.g., a layer or a device) is "on," "above," or "below" another component (e.g., a layer or a device) of a semiconductor device (e.g., 3D memory device 100) is determined relative to the substrate (e.g., substrate 102) of the semiconductor device in the z-direction (the vertical direction) when the substrate is positioned in the lowest plane of the semiconductor device in the z-direction. The same notion for describing spatial relationships is applied throughout the present disclosure.

In some embodiments, 3D memory device 100 is part of a monolithic 3D memory device, in which the components of the monolithic 3D memory device (e.g., memory cells and peripheral devices) are formed on a single substrate (e.g., substrate 102). Peripheral devices 111, such as any suitable digital, analog, and/or mixed-signal peripheral circuits used for facilitating the operation of 3D memory device 100, can be formed on substrate 102 as well, outside of memory stack 104. Peripheral device 111 can be formed "on" substrate 102, where the entirety or part of peripheral device 111 is formed in substrate 102 (e.g., below the top surface of substrate 102) and/or directly on substrate 102. Peripheral device 111 can include one or more of a page buffer, a decoder (e.g., a row decoder and a column decoder), a sense amplifier, a driver, a charge pump, a current or voltage reference, or any active or passive components of the circuits (e.g., transistors, diodes, resistors, or capacitors). Isolation regions (e.g., shallow trench isolations (STIs)) and doped regions (e.g., source regions and drain regions of the transistors) can be formed in substrate 102 as well, outside of memory stack 104. It is understood that in some embodiments, peripheral devices 111 are formed above or below NAND memory strings 106, as opposed to on the side of NAND memory strings 106 as shown in FIG. 1. It is further understood that in some embodiments, 3D memory device 100 is part of a non-monolithic 3D memory device, in which the components are formed separately on different substrates and then bonded in a face-to-face manner, a face-to-back manner, or a back-to-back manner Peripheral devices 111 can be formed on a separate substrate different from substrate 102.

As shown in FIG. 1, memory stack 104 can include an inner region 116 (also known as a "core array region") and an outer region 118 (also known as a "staircase region"). In some embodiments, inner region 116 is the center region of memory stack 104 where an array of NAND memory strings 106 are formed through the conductor/dielectric layer pairs, and outer region 118 is the remaining region of memory stack 104 surrounding inner region 116 (including the sides and edges) without NAND memory strings 106.

As shown in FIG. 1, each NAND memory string 106 can include a channel structure 108 extending vertically through the conductor/dielectric layer pairs in inner region 116 of memory stack 104. Channel structure 108 can include a channel hole filled with semiconductor materials (e.g., forming a semiconductor channel) and dielectric materials (e.g., forming a memory film). In some embodiments, the semiconductor channel includes silicon, such as amorphous silicon, polysilicon, or single crystalline silicon. In some embodiments, the memory film is a composite layer including a tunneling layer, a storage layer (also known as a "charge trap/storage layer"), and a blocking layer. Each NAND memory string 106 can have a cylinder shape (e.g., a pillar shape). The semiconductor channel, tunneling layer, storage layer, and blocking layer are arranged along a direction from the center toward the outer surface of the pillar in this order, according to some embodiments. The tunneling layer can include silicon oxide, silicon oxynitride, or any combination thereof. The storage layer can include silicon nitride, silicon oxynitride, silicon, or any combination thereof. The blocking layer can include silicon oxide, silicon oxynitride, high dielectric constant (high-k) dielectrics, or any combination thereof.

In some embodiments, NAND memory strings 106 include a plurality of control gates (each being part of a word line/conductive layer 110) for NAND memory strings 106. Conductive layer 110 in each conductor/dielectric layer pair can function as a control gate for memory cells of NAND memory string 106. Conductive layer 110 can include multiple control gates for multiple NAND memory strings 106 and can extend laterally as a word line ending in outer region 118 of memory stack 104.

In some embodiments, NAND memory string 106 includes two plugs 117 and 119 at a respective end in the vertical direction. Each plug 117 or 119 can be in contact with a respective end of channel structure 108. Plug 117 can include a semiconductor material, such as silicon, that is epitaxially grown from substrate 102. Plug 117 can function as the channel controlled by a source select gate of NAND memory string 106. Plug 117 can be at the lower end of NAND memory string 106 and in contact with channel structure 108 (e.g., on the lower end of channel structure 108). As used herein, the "upper end" of a component (e.g., NAND memory string 106) is the end father away from substrate 102 in the z-direction, and the "lower end" of the component (e.g., NAND memory string 106) is the end closer to substrate 102 in the z-direction when substrate 102 is positioned in the lowest plane of 3D memory device 100.

Plug 119 can include semiconductor materials (e.g., polysilicon) or conductor materials (e.g., metals). In some embodiments, plug 119 includes an opening filled with titanium/titanium nitride (Ti/TiN as a barrier layer) and tungsten (as a conductor). By covering the upper end of channel structure 108 during the fabrication of 3D memory device 100, plug 119 can function as an etch stop layer to prevent etching of dielectrics filled in channel structure 108, such as silicon oxide and silicon nitride. In some embodiments, plug 119 functions as the drain of NAND memory string 106.

As shown in FIG. 1, at least on one side in the lateral direction (e.g., in the x-direction), outer region 118 of memory stack 104 can include a staircase structure 142. In some embodiments, another m (not shown) is disposed on the opposite side of memory stack 104 in the x-direction. Each "level" of staircase structure 142 can include one or more conductor/dielectric layer pairs, each including conductive layer 110 and dielectric layer 112. The top layer in each level of staircase structure 142 can be conductive layer 110 for interconnection in the vertical direction. In some embodiments, each two adjacent levels of staircase structure 142 are offset by a nominally same distance in the vertical direction and a nominally same distance in the lateral direction. For each two adjacent levels of staircase structure 142, the first level (and conductive layer and dielectric layer therein) that is closer to substrate 102 can extend laterally further than the second level (and conductive layer and dielectric layer therein), thereby forming a "landing area" on the first level for interconnection in the vertical direction.

Staircase structure 142 can be used for landing word line contacts 144. The lower end of each word line contact 144 can be in contact with top conductive layer 110 (word line) in a respective level of staircase structure 142 to individually address a corresponding word line of 3D memory device 100. Word line contact 144 can include an opening (e.g., a via hole or a trench) extending vertically through one or more dielectric layers and filled with conductive materials including, but not limited to, W, Co, Cu, Al, silicides, or any combination thereof.

As shown in FIG. 1, 3D memory device 100 further includes TSCs 136 each extending vertically through the conductor/dielectric layer pairs in staircase structure 142. Each TSC 136 can extend vertically through interleaved conductive layers 110 and dielectric layers 112. In some embodiments, TSC 136 can extend through the entire thickness of staircase structure 142 (e.g., all the conductor/dielectric layer pairs in the vertical direction at a lateral position of staircase structure 142) and reach substrate 102. In some embodiments, TSC 136 further extends through at least part of substrate 102. TSC 136 can carry electrical signals from and/or to 3D memory device 100, such as part of the power bus, with shorten interconnect routing. In some embodiments, TSC 136 can provide electrical connections between 3D memory device 100 and peripheral device 111 and/or between back-end-of-line (BEOL) interconnects (not shown) and peripheral device 111. TSC 136 can also provide mechanical support to staircase structure 142.

TSC 136 can be formed by filling materials in a vertical opening through staircase structure 142. In some embodiments, TSC 136 includes a conductor layer 140 surrounded by a spacer 138. For example, the sidewall of TSC 136 may be in contact with spacer 138. Conductor layer 140 can include conductive materials, including, but not limited to, W, Co, Cu, Al, doped silicon, silicides, or any combination thereof. Spacer 138 can electrically insulate conductor layer 140 of TSC 136 from surrounding conductive layers 110 in staircase structure 142. In some embodiments, TSC 136 has a substantially circular shape in the plan view, and conductor layer 140 and spacer 138 are disposed radially from the center of TSC 136 in this order. Spacer 138 can include dielectric materials including, but not limited to, silicon oxide, silicon nitride, silicon oxynitride, or any combination thereof.

As shown in FIG. 1, 3D memory device 100 can further include peripheral contacts 148 extending vertically through one or more dielectric layers and in contact with peripheral devices 111 outside of memory stack 104. Peripheral contact 148 can provide electrical connections with peripheral devices 111. Peripheral contact 148 can be formed by filling materials in a vertical opening. In some embodiments, similar to TSC 136, peripheral contact 148 may include a conductor layer 152 surrounded by a spacer 150. Conductor layer 152 can include conductive materials, including, but not limited to, W, Co, Cu, Al, doped silicon, silicides, or any combination thereof. In some embodiments, peripheral contact 148 has a substantially circular shape in the plan view, and conductor layer 152 and spacer 150 are disposed radially from the center of peripheral contact 148 in this order. Spacer 150 can include dielectric materials including, but not limited to, silicon oxide, silicon nitride, silicon oxynitride, or any combination thereof. In some embodiments, spacer 150 and spacer 138 have nominally the same thickness in the lateral direction (e.g., radial direction). In some embodiments, both spacer 150 and spacer 138 include silicon oxide. It is understood that peripheral devices 111 may not be formed on substrate 102, and peripheral contacts 148 may be in a different configuration in some embodiments, for example, in which 3D memory device 100 is a non-monolithic 3D memory device.

It is understood that 3D memory device 100 can include additional components and structures not shown in FIG. 1 including, but not limited to, other local contacts and interconnects in one or more BEOL interconnect layers above memory stack 104 and/or below substrate 102.

Figure 2A:
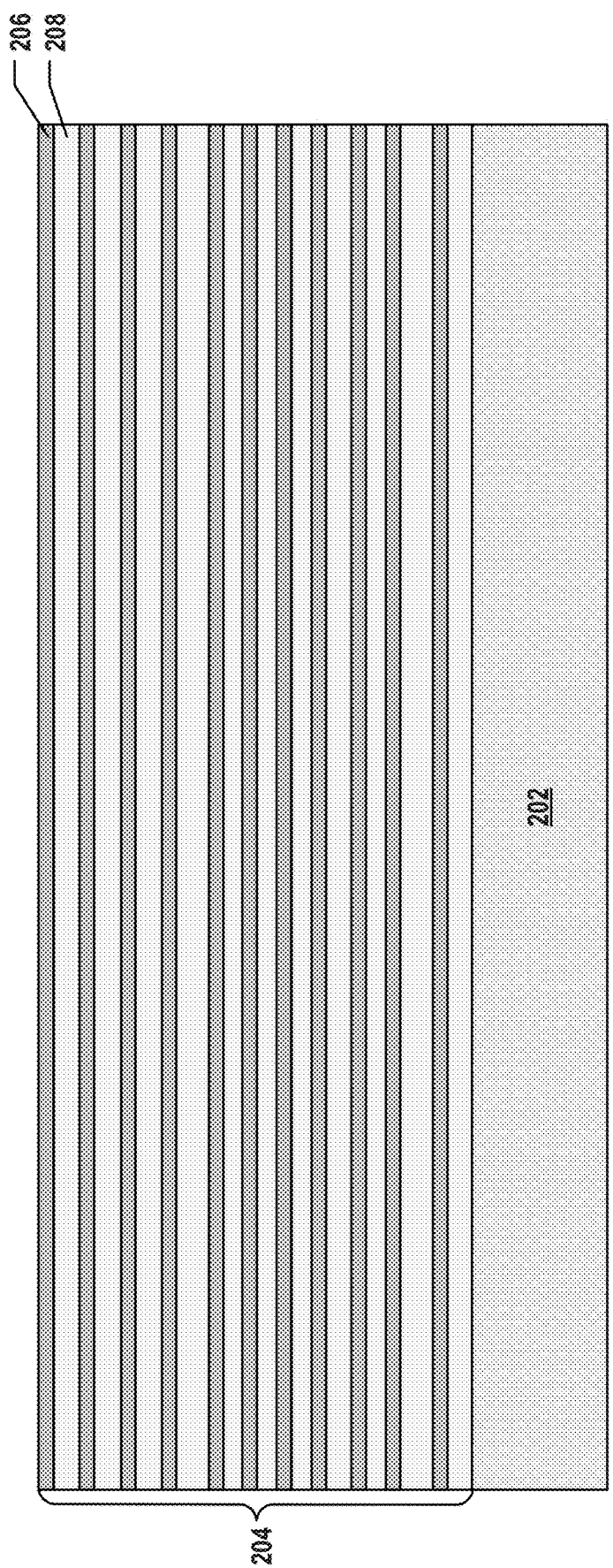
FIGS. 2A-2C illustrate an exemplary fabrication process for forming channel structures and staircase structures of a 3D memory device, according to some embodiments of the present disclosure.
Figure 2B:
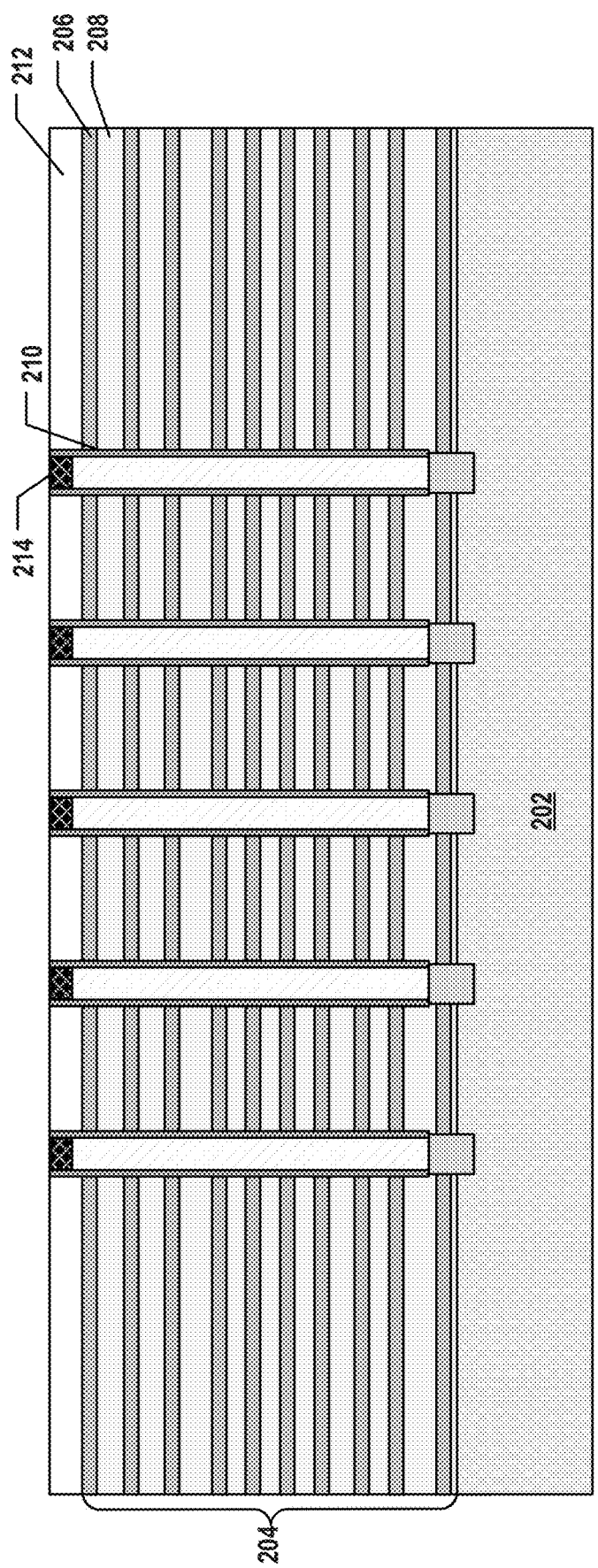
Figure 2C:
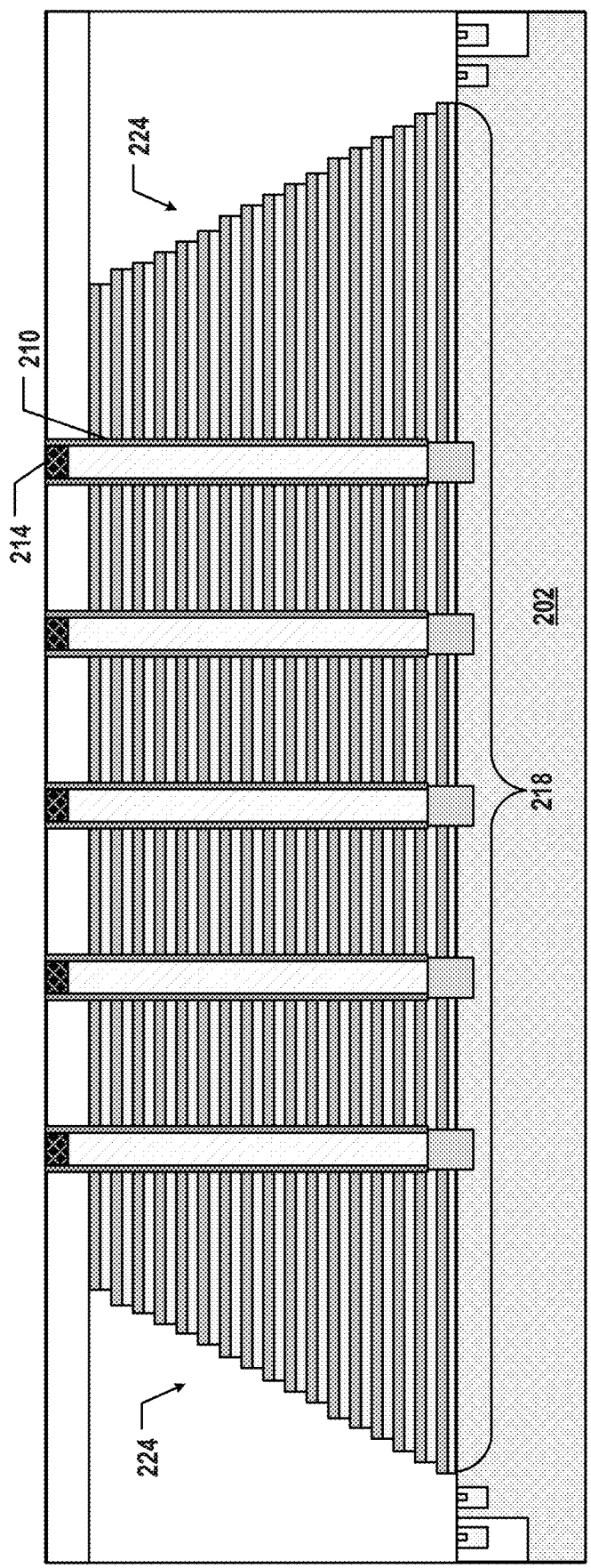
Figure 4A:
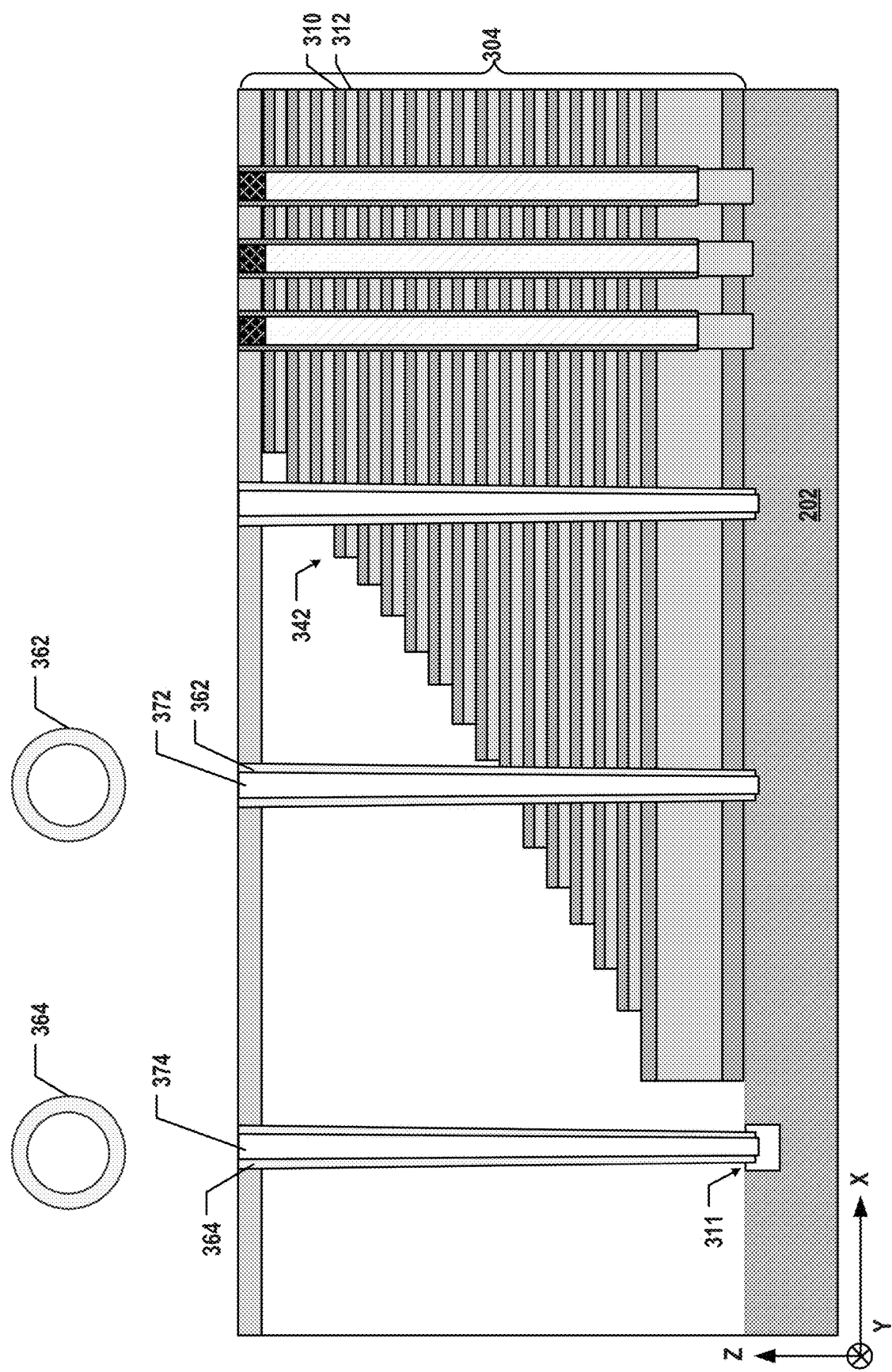
FIGS. 4A-4D illustrate another exemplary fabrication process for forming TSCs, peripheral contacts, and word line contacts of a 3D memory device, according to some embodiments of the present disclosure.
Figure 4B:
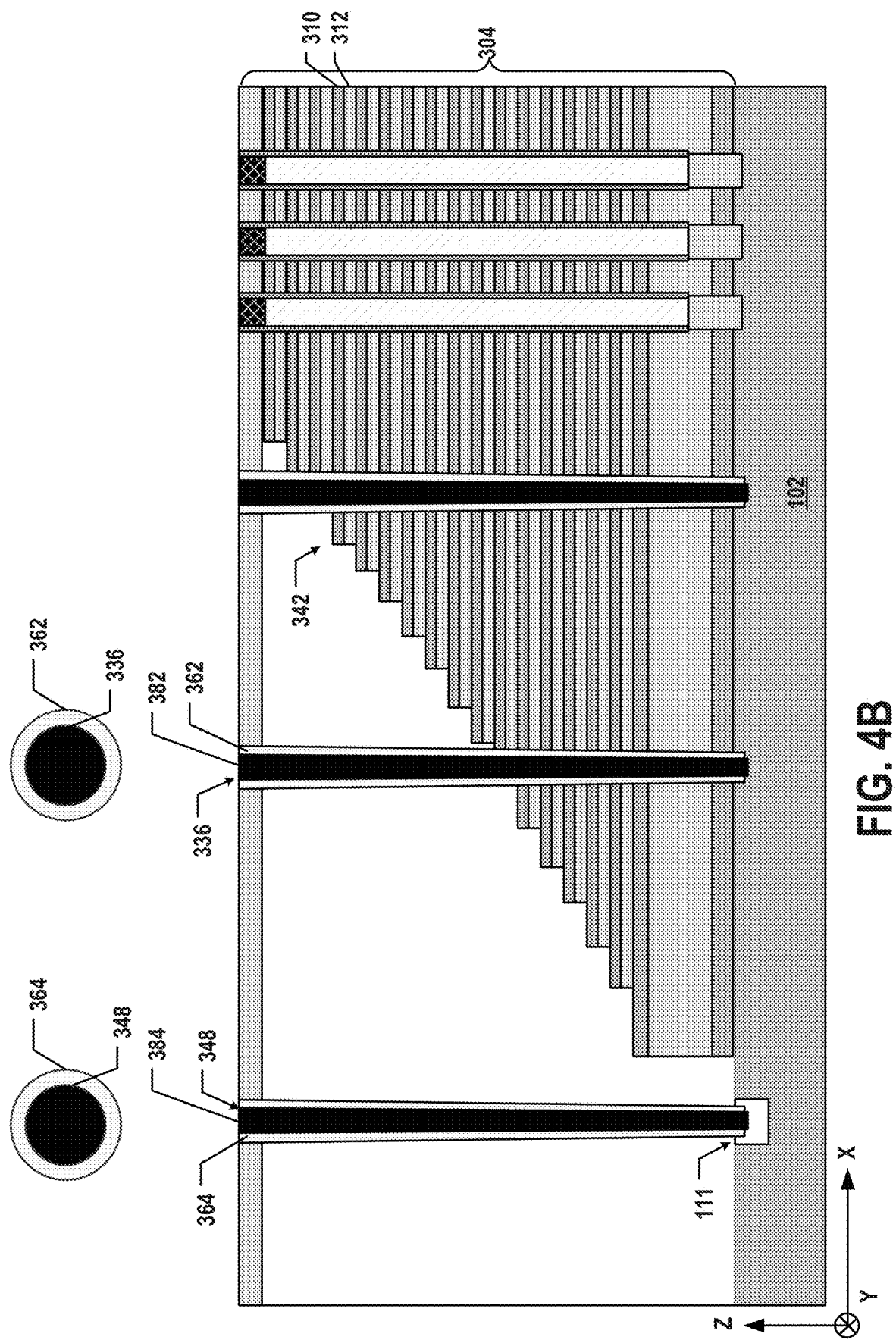
Figure 4C:
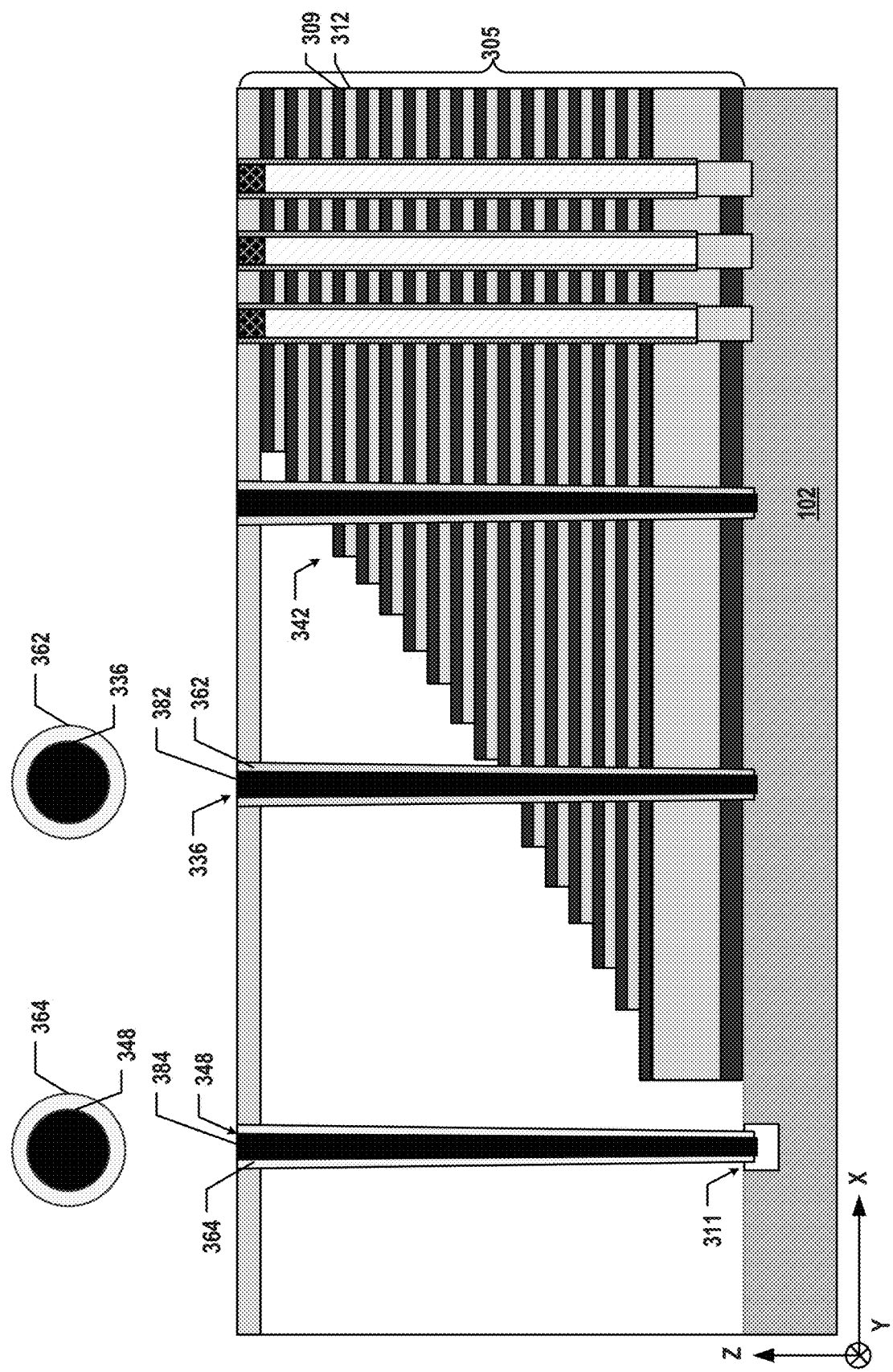
Figure 4D:
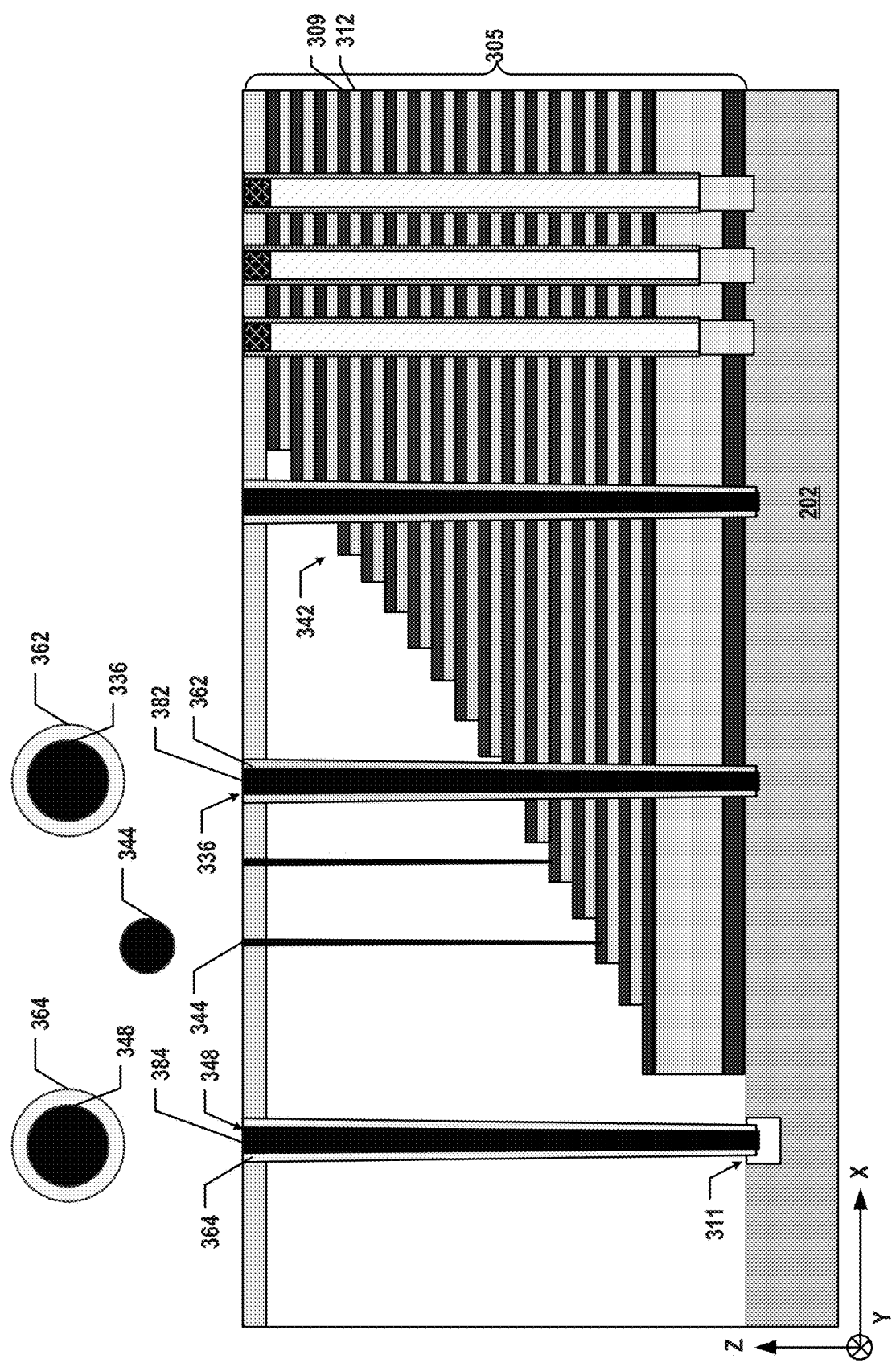
Figure 5A:
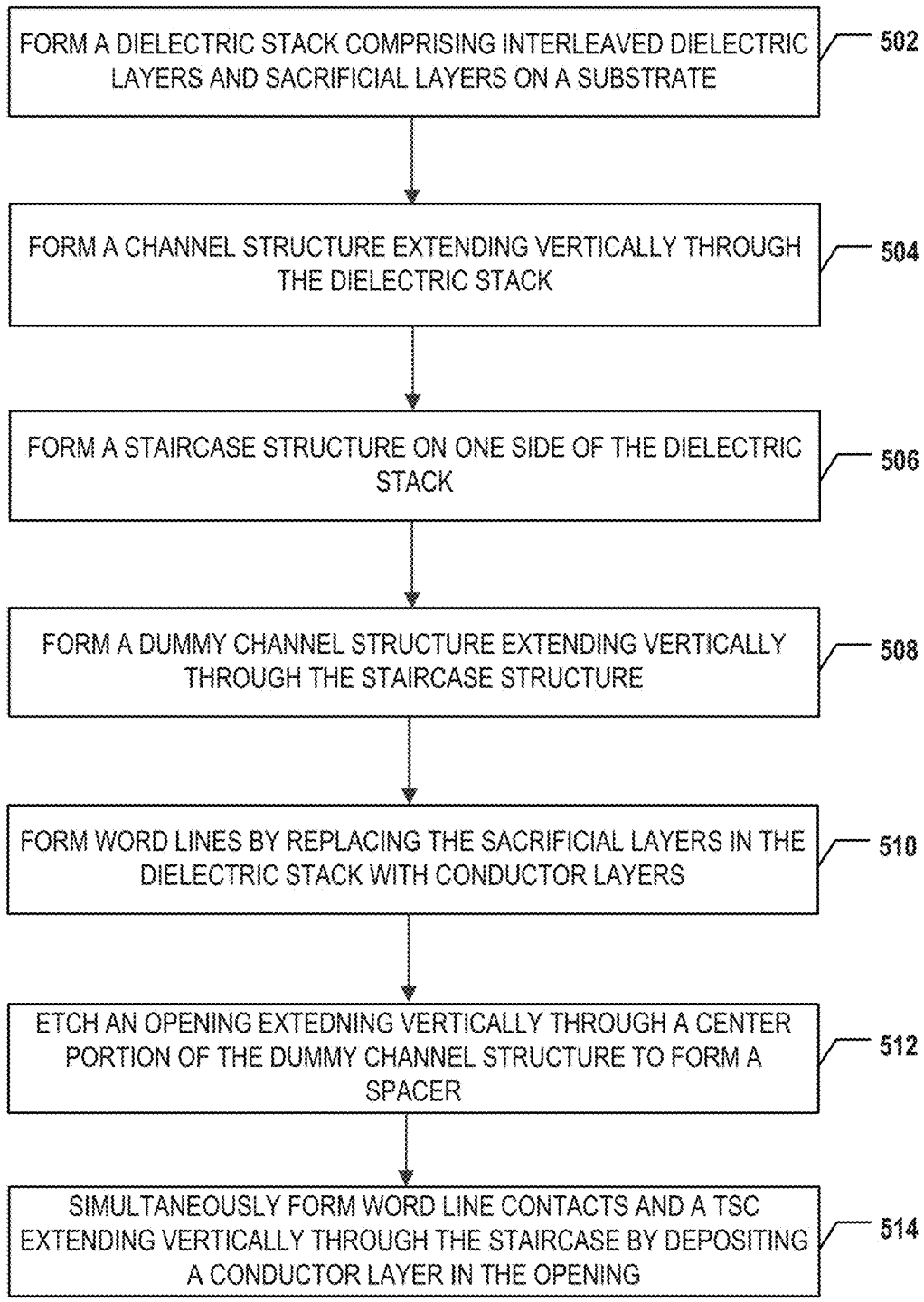
FIGS. 5A-5C are flowcharts of exemplary methods for forming a 3D memory device, according to some embodiments.
Figure 5B:
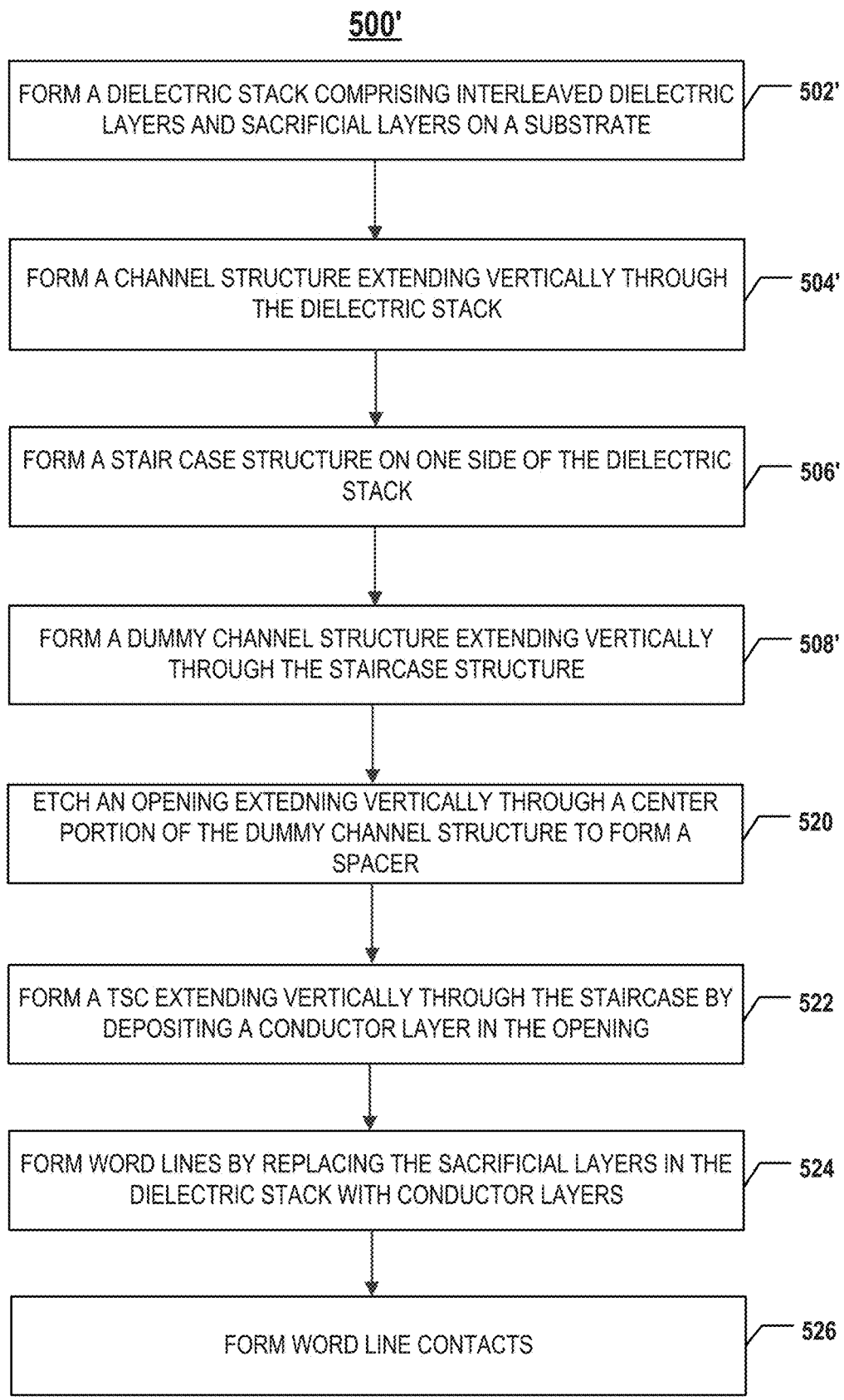
Figure 5C:
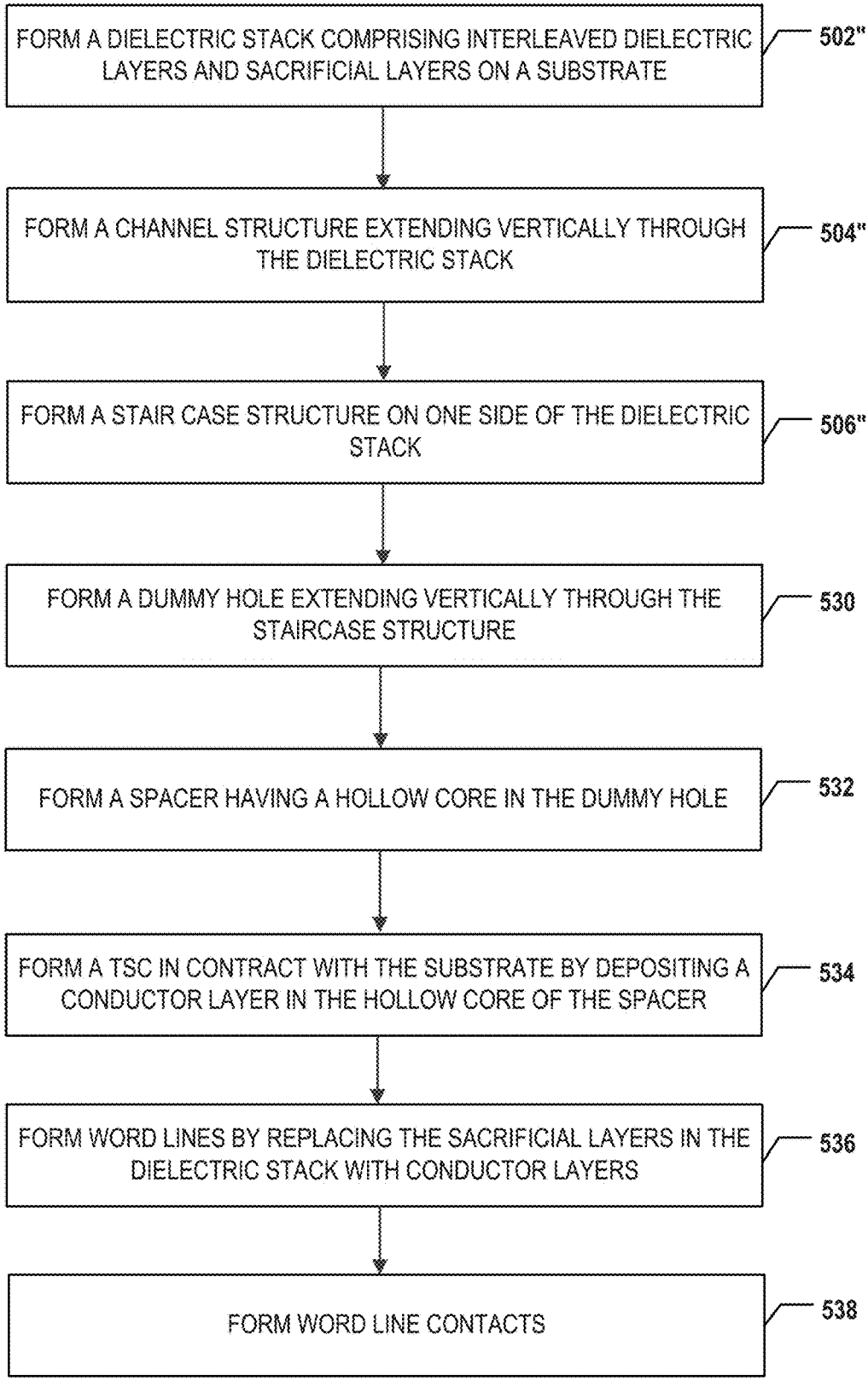

FIGS. 2A-2C illustrate an exemplary fabrication process for forming channel structures and staircase structures of a 3D memory device, according to some embodiments of the present disclosure. FIGS. 3A-3E illustrate an exemplary fabrication process for forming TSCs, peripheral contacts, and word line contacts of a 3D memory device, according to various embodiments of the present disclosure. FIGS. 4A-4D illustrate another exemplary fabrication process for forming TSCs, peripheral contacts, and word line contacts of a 3D memory device, according to some embodiments of the present disclosure. FIGS. 5A-5C are flowcharts of exemplary methods 500, 500', and 500" for forming a 3D memory device, according to some embodiments. Examples of the 3D memory device depicted in FIGS. 2-5 include 3D memory device 100 depicted in FIG. 1. FIGS. 2-5 will be described together. It is understood that the operations shown in methods 500, 500', and 500" are not exhaustive and that other operations can be performed as well before, after, or between any of the illustrated operations. Further, some of the operations may be performed simultaneously, or in a different order than shown in FIGS. 5A-5C.

Referring to FIG. 5A, method 500 starts at operation 502, in which a dielectric stack including a plurality of interleaved dielectric layers and sacrificial layers is formed on a substrate. The substrate can be a silicon substrate. Method 500 proceeds to operation 504, as illustrated in FIG. 5A, in which a channel structure extending vertically through the dielectric stack is formed. Method 500 proceeds to operation 506, in which a staircase structure is formed on one side of the dielectric stack.

As illustrated in FIG. 2A, a dielectric stack 204 including a plurality of interleaved dielectric layers and sacrificial layers is formed on a silicon substrate 202. In some embodiments, sacrificial layers 206 and dielectric layers 208 are alternatingly deposited by one or more thin film deposition processes including, but not limited to, physical vapor deposition (PVD), chemical vapor deposition (CVD), atomic layer deposition (ALD), or any combination thereof. In some embodiments, sacrificial layers 206 include silicon nitride, and dielectric layers 208 include silicon oxide. It is understood that the sequence of depositing sacrificial layers 206 and dielectric layers 208 is not limited. The deposition can start with sacrificial layer 206 or dielectric layer 208 and can end with sacrificial layer 206 or dielectric layer 208.

As illustrated in FIG. 2B, an array of channel structures 210 are formed, each of which extends vertically through interleaved sacrificial layers 206 and dielectric layers 208 in dielectric stack 204. In some embodiments, fabrication processes to form channel structure 210 include forming a channel hole through interleaved sacrificial layers 206 and dielectric layers 208 in dielectric stack 204 using dry etching/and or wet etching, such as deep reactive-ion etching (DRIE), followed by filling the channel hole with a plurality of layers, such as a dielectric layer and a semiconductor layer, using thin film deposition processes. In some embodiments, the dielectric layer is a composite dielectric layer, such as a combination of multiple dielectric layers including, but not limited to, a tunneling layer, a storage layer, and a blocking layer. The tunneling layer can include dielectric materials including, but not limited to, silicon oxide, silicon nitride, silicon oxynitride, or any combination thereof. The storage layer can include materials for storing charge for memory operation. The storage layer materials can include, but not limited to, silicon nitride, silicon oxynitride, a combination of silicon oxide and silicon nitride, or any combination thereof. The blocking layer can include dielectric materials including, but not limited to, silicon oxide or a combination of silicon oxide/silicon oxynitride/silicon oxide (ONO). The blocking layer can further include a high-k dielectric layer, such as an aluminum oxide ($Al_2O_3$) layer. The semiconductor layer can include polysilicon, serving as a semiconductor channel. The semiconductor layer and dielectric layer can be formed by processes such as ALD, CVD, PVD, or any combination thereof.

In some embodiments, dielectric stack 204 may be joined by another dielectric stack to form a multi-stack structure through a joint layer 212. As illustrated in FIG. 2B, joint layer 212 can be formed on dielectric stack 204 by depositing a dielectric layer, such as a silicon oxide layer, using thin film deposition processes, such as ALD, CVD, PVD, or any combination thereof. An array of inter-deck plugs 214 can be formed in joint layer 212 and in contact with the array of channel structures 210, respectively. Inter-deck plugs 214 can be formed by patterning and etching openings through joint layer 212, followed by the deposition of semiconductor materials, such as polysilicon, using thin film deposition processes, such as ALD, CVD, PVD, or any combination thereof. In the following, embodiments of the present disclosure are described with respect to a single-stack structure for conciseness and simplicity. It is understood that technical solutions disclosed herein are applicable to multi-stack structure as well.

As illustrated in FIG. 2C, staircase structures 224 are formed on the sides of dielectric stack 218. Staircase structure 224 can be formed by the so-called "trim-etch" processes, which, in each cycle, trim (e.g., etching incrementally and inwardly, often from all directions) a patterned photoresist layer, followed by etching the exposed portions of the dielectric/sacrificial layer pair using the trimmed photoresist layer as an etch mask to form one step of staircase structure 224.

Method 500 proceeds to operation 508, as illustrated in FIG. 5A, in which a dummy channel structure extending vertically through the staircase structure is formed. In some embodiments, dummy channel structures are formed as intermediate structures that are later replaced by TSCs. As illustrated in FIG. 3B, an array of dummy channel structures 302 are formed through a staircase structure 342 of a dielectric stack 304. Dielectric stack 304 includes interleaved dielectric layers 312 and sacrificial layers 310.

Dummy channel structure 302 can extend vertically through staircase structure 342 and have a vertical opening filled with the same materials as those in channel structure 108. Different from channel structures 108, a contact is not formed on dummy channel structure 302 to provide electrical connections with other components of a 3D memory device such as 3D memory device 100, according to some embodiments. In some embodiments, dummy channel structure 302 is fully filled with dielectric materials including, but not limited to, silicon oxide, silicon nitride, silicon oxynitride, or any combination thereof.

Dummy channel structure 302 can be used for balancing load in certain processes during fabrication (e.g., etching and chemical mechanical polishing (CMP)) and for providing mechanical support to memory array structures, e.g., staircase structure 342. Embodiments of the present disclosure can form TSCs from dummy channel structures, thereby using the same pattern to form both the dummy channel structures and TSCs. The resulting TSCs can provide the balancing and supporting functions of the dummy channel structures.

Figure 3A:
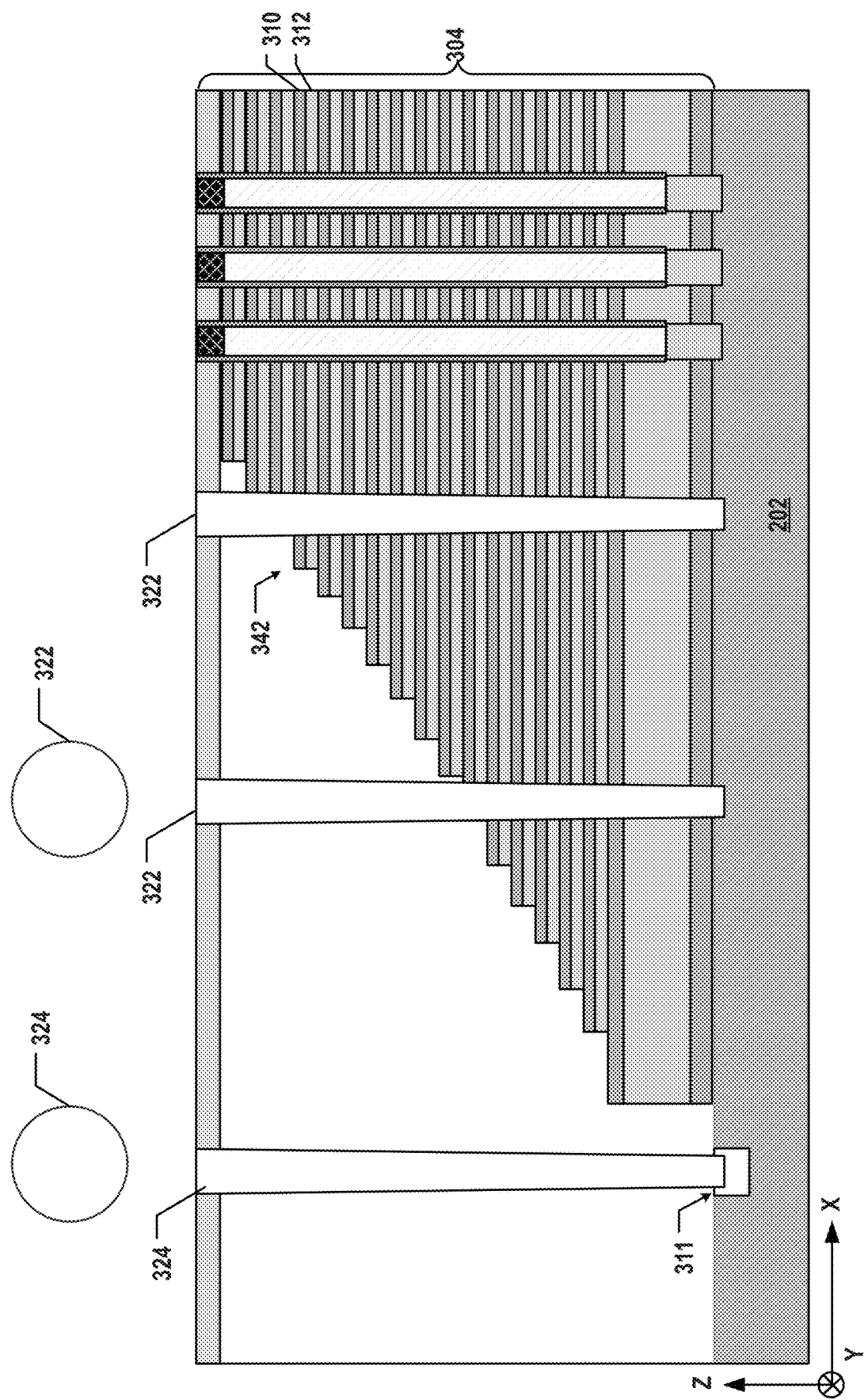
FIGS. 3A-3E illustrate exemplary fabrication processes for forming TSCs, peripheral contacts, and word line contacts of a 3D memory device, according to various embodiments of the present disclosure.
Figure 3B:
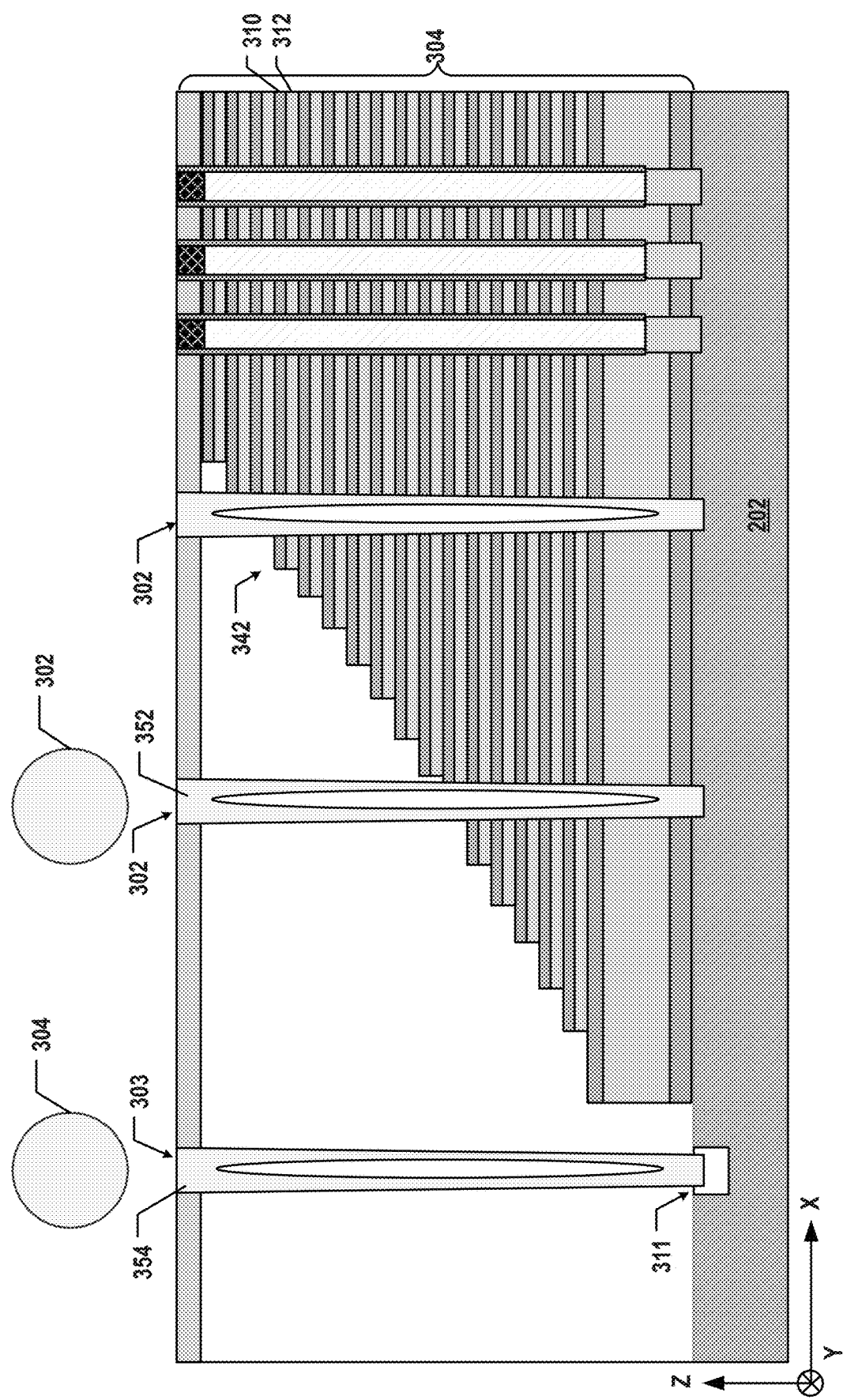

As shown in FIG. 3A, dummy channel structure 302 can be formed by first etching a dummy hole 322 through one or more dielectric layers in staircase structure 342 using wet etching and/or dry etching, such as DRIE. In some embodiments, dummy hole 322 may extend vertically through all of the dielectric layers in staircase structure 342 and expose part of silicon substrate 202 (e.g., dummy hole 322 may extend to silicon substrate 202). In some embodiments, dummy hole 322 may extend into silicon substrate 202 (e.g., part of silicon substrate 202 may be etched away during the etching process).

In some embodiments, a dummy hole 324 outside dielectric stack 304 may be formed simultaneously (e.g., in the same fabrication steps) with forming dummy hole 322. Dummy hole 324 may be used to form a peripheral contact providing interconnect to a peripheral device 311. In some embodiments, dummy holes 322 and 324 may have a nominally circular shape in the plan view, as shown in FIG. 3A. In some embodiments, the size of dummy holes 322 and 324 may be nominally the same.

Referring back to FIG. 3B, dummy holes 322 shown in FIG. 3A may be filled (deposited) with a dielectric layer 352, such as a silicon oxide layer, to form dummy channel structures 302 using one or more thin film deposition processes, such as ALD, CVD, PVD, or any combination thereof. In some embodiments, dummy channel structures 302 are formed simultaneously with channel structures 210 in the same fabrication steps, such that dummy holes 322 is filled with at least some of the materials filling in channel structures 210.

In some embodiments, a dummy channel structure 303 outside dielectric stack 304 is formed simultaneously (e.g., in the same fabrication steps) with forming dummy channel structure 302 by depositing a dielectric layer 354 in dummy hole 324. Dielectric layer 354 may have the same material as dielectric layer 352.

In some embodiments, dummy holes 322/324 may be fully filled with dielectric layer 352/354, respectively. In other embodiments, dummy holes 322 or 324 may be partially filled, as shown in FIG. 3B. In such cases, the resulting dummy channel structure 302/303 may have the top, bottom, and sidewall portions deposited with dielectric layer 352/354. The center region may not be fully filled.

Figure 3C:
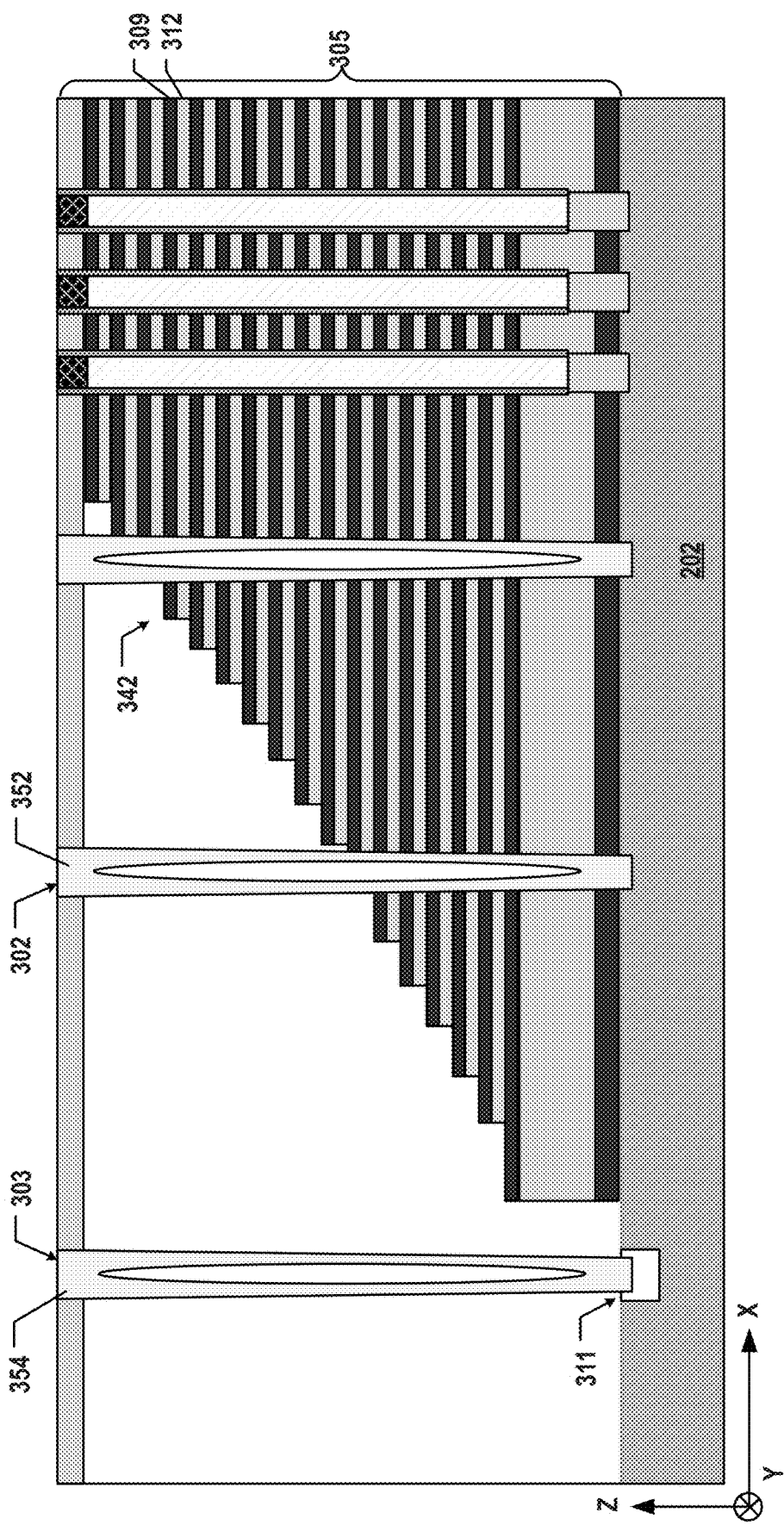

Method 500 proceeds to operation 510, as illustrated in FIG. 5A, in which a plurality of word lines are formed by replacing the sacrificial layers in the dielectric stack with conductive layers. As shown in FIG. 3C, sacrificial layers 310 are replaced by conductive layers (functioned as word lines) 309. The replacement of sacrificial layers 310 with conductive layers 309 can be performed by wet etching sacrificial layers 310 (e.g., silicon nitride) selective to dielectric layers 312 (e.g., silicon oxide) and filling the structure with conductive layers 309 (e.g., W). Conductive layers 309 can be deposited by PVD, CVD, ALD, electrochemical depositions, or any combination thereof. Conductive layers 309 can include conductive materials including, but not limited to, W, Co, Cu, Al, polysilicon, silicides, or any combination thereof. As a result, after the gate replacement processes, dielectric stack 304 in FIGS. 3A-3B becomes a memory stack 305 including the conductive/dielectric layer pairs, i.e., interleaved conductive layers 309 and dielectric layers 312, on silicon substrate 202.

Figure 3D:
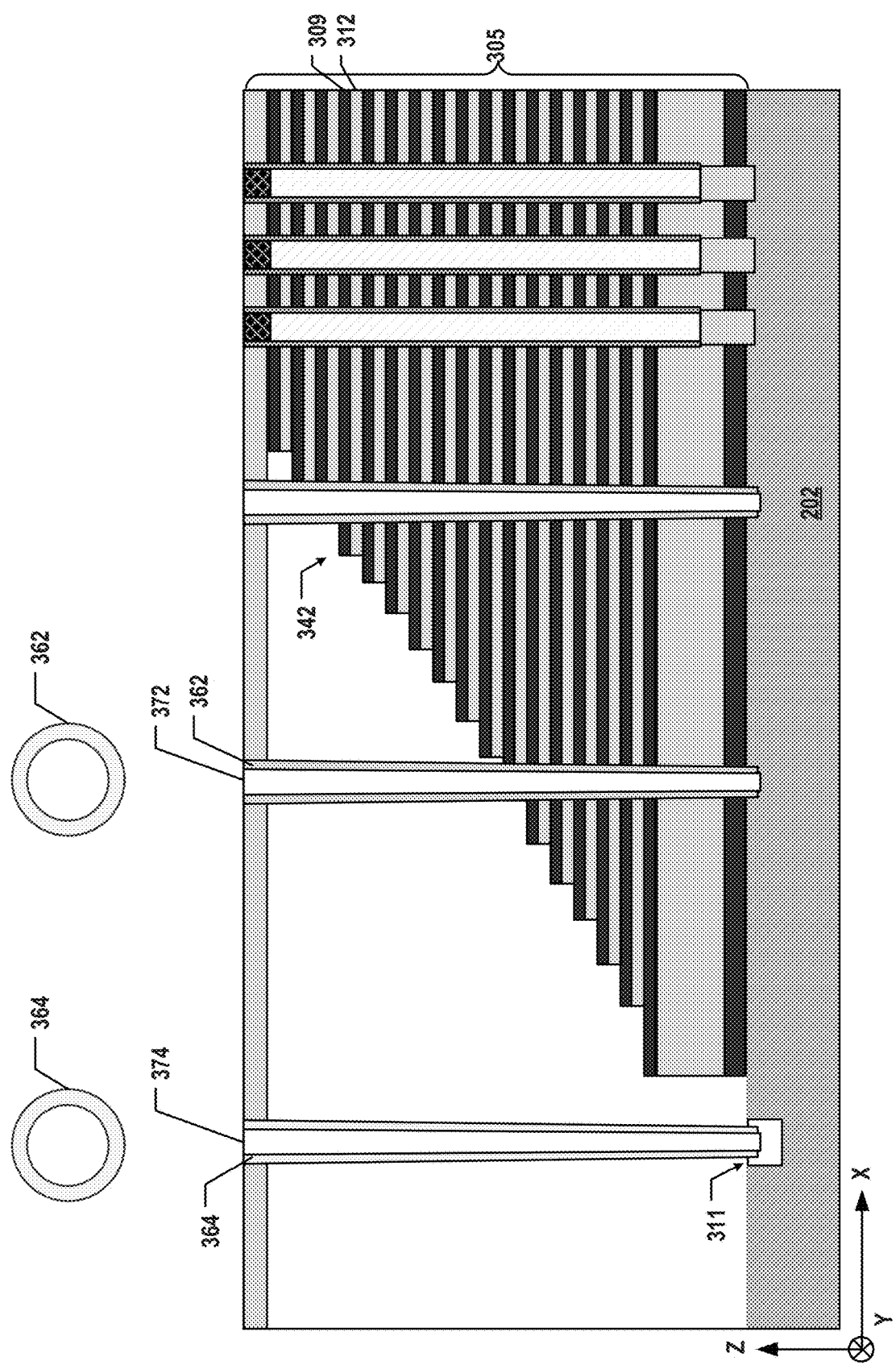

Method 500 proceeds to operation 512, in which an opening extending vertically through a center portion of the dummy channel structure is etched to form a spacer. Referring to FIG. 3D, an opening 372 (TSC hole) is etched through dummy channel structure 302 (shown in FIGS. 3B-3C) to form a spacer 362. In some embodiments, opening 372/spacer 362 may extend vertically through the interleaved dielectric layers 312 and conductive layer 309 in staircase structure 342 to reach silicon substrate 202. In some embodiments, a second opening 374 (peripheral contact hole) may be simultaneously formed from dummy channel structure 303 (shown in FIGS. 3B-3C). Opening 372/374 may be etched using wet etching and/or drying etching process, such as DRIE. For example, a center portion of dummy channel structure 302/303 may be removed by etching to form spacer 362/364 with a hollow core, as shown in FIG. 3D. In some embodiments, the sidewalls of spacers 362 and 364 may have a nominally same thickness. The depths of TSC hole 372 and peripheral contact hole 374 in the vertical direction can be nominally the same. The lateral dimensions of TSC hole 372 and peripheral contact hole 374, such as the diameters, can be nominally the same or different in various embodiments. For example, the diameter of TSC hole 372 can be greater than the diameter of peripheral contact hole 374, according to some embodiments.

As shown in FIG. 3D, TSC hole 372 and peripheral contact hole 374 can reach to silicon substrate 202, and the lower end of peripheral contact hole 374 can be in contact with peripheral device 311 formed on silicon substrate 202. In some embodiments, peripheral device 311 includes transistors, which can be formed by a plurality of processes including, but not limited to, photolithography, dry/wet etch, thin film deposition, thermal growth, implantation, CMP, and any other suitable processes. In some embodiments, doped regions are formed in silicon substrate 202 by ion implantation and/or thermal diffusion, which function, for example, as source regions and/or drain regions of the transistors. In some embodiments, isolation regions (e.g., STIs) are also formed in silicon substrate 202 by wet etching and/or dry etching and thin film deposition processes. The fabrication process for forming peripheral device 311 can occur at any fabrication stage prior to the etching of peripheral contact hole 374.

Because opening 372/374 is etched from dummy channel structure 302/303 by removing part of the dielectric layer deposited thereon, the remaining portion, including the sidewall of the dummy channel structure 302/303 after opening 372/274 is formed, becomes spacer 362/364. Spacer 362/264 can provide mechanical support to memory stack 305, including staircase structure 342, similar to dummy channel structure 302/303. In addition, spacer 362/364 can function as an insulation layer surrounding the conductor layer deposited into opening 372/374 to form a TSC/peripheral contact.

In some embodiments, opening 372/374 (defined by the inner wall of spacer 362/364) may have a nominally circular shape in the plan view, as shown in FIG. 3D. In some embodiments, the sidewalls of spacer 362 and 364 may have a nominally same thickness. In some embodiments, spacer 362 and 364 may have the same or different size. For example, the diameter of spacer 364 (e.g., measured from the inner or outer sidewall) may be smaller than the diameter of spacer 362.

Figure 3E:
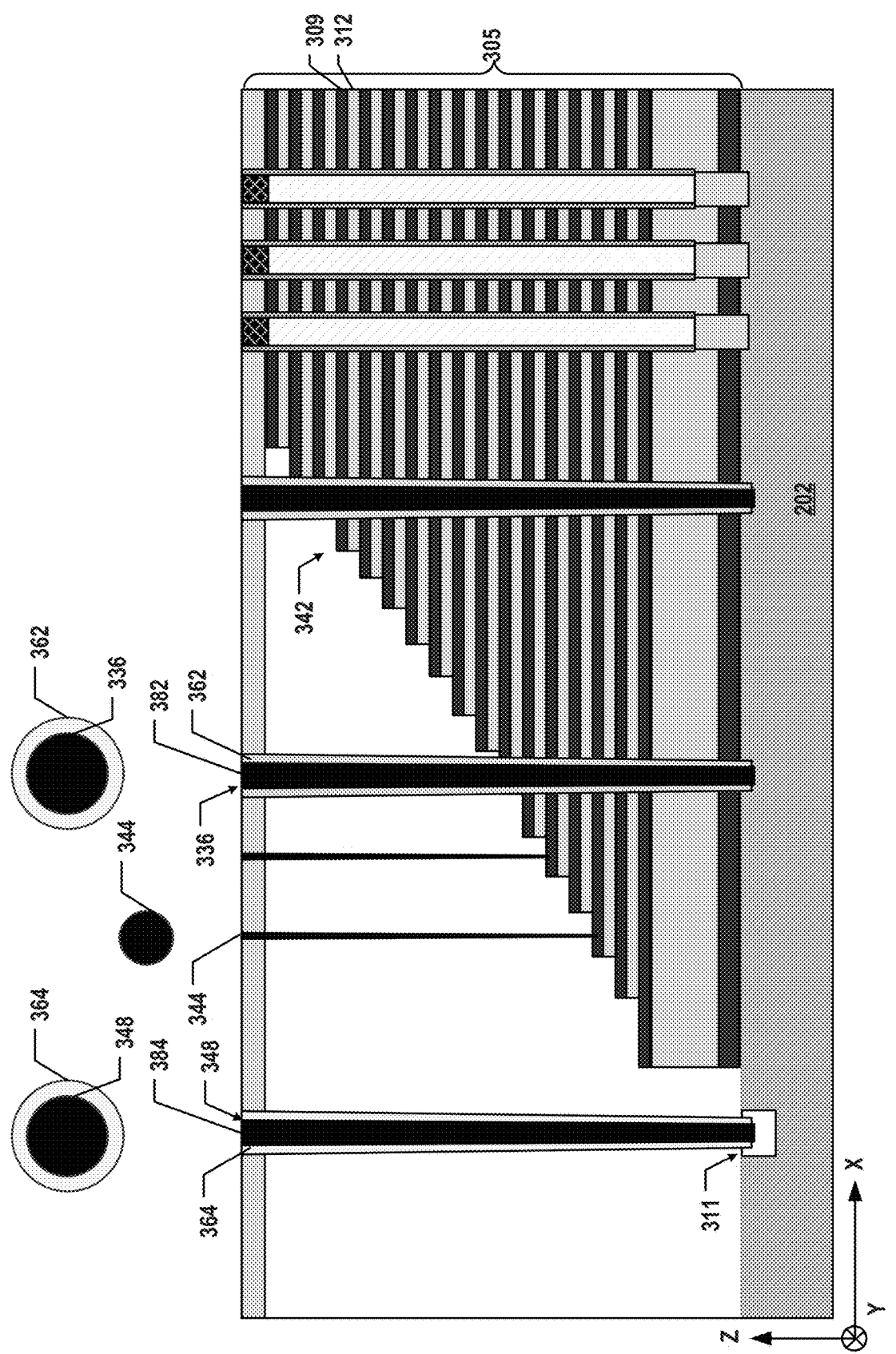

Method 500 proceeds to operation 514, as illustrated in FIG. 5A, in which word line contacts and TSCs are simultaneously formed. In some embodiments, a conductor layer is deposited in an opening to form a TSC. In some embodiments, the conductor layer is a composite layer including an adhesion/barrier layer and a conductor. As illustrated in FIG. 3E, a conductor layer 382 is deposited in opening 372 (as shown in FIG. 3D) to fill the remaining space of opening 372, thereby forming a TSC 336 extending vertically through staircase structure 342. In some embodiments, a conductor can be formed in the remaining space of opening 372 by depositing metals, such as tungsten, using one or more thin film deposition processes, such as ALD, CVD, PVD, electrochemical depositions, or any combination thereof. A conductor layer 384 can be simultaneously formed in opening 374 (as shown in FIG. 3D) to form a peripheral contact 348 in contact with peripheral device 311, using the same deposition processes. In some embodiments, conductor layers 382 and 384 may use the same material (e.g., tungsten (W)). The excess conductor layer after deposition can be removed by CMP.

Word line contacts 344 can be formed simultaneously (e.g., in the same fabrication steps) with TSCs. Each word line contact 344 is in contact with a respective one of conductive layers 309 of the conductor/dielectric layer pairs in staircase structure 342. Word line contacts 344 are formed through one or more dielectric layers by first etching vertical openings (e.g., by wet etching and/or dry etching), followed by filling the openings with conductive materials using ALD, CVD, PVD, electrochemical depositions, or any combination thereof. In some embodiments, other conductive materials are filled in the openings to function as an adhesion/barrier layer. Etching of dielectric layers to form the openings of word line contacts 344 can be controlled by etch stop at a different material. For example, etching of dielectric layers can be stopped when reaching conductive layers 309 in staircase structure 342.

In some embodiments, TSC 336, word line contact 344, and peripheral contact 348 may have a nominally circular shape in a plan view, as shown in FIG. 3E. TSC 336, word line contact 344, and peripheral contact 348 may have the same or different sizes. For example, TSC 336 and peripheral contact 348 may have a larger diameter than that of word line contact 344, according to some embodiments.

FIG. 5B is a flowchart of another exemplary method 500' for forming a 3D memory device, according to some embodiments of the present disclosure. Operations 502', 504', 506', and 508' are similar to operations 502, 504, 506, and 508, respectively, and thus are not repeated. Method 500' proceeds to operation 520, as illustrated in FIG. 5B, in which an opening is etched extending vertically through a center portion of the dummy channel structure to form a spacer. Operation 520 is similar to operation 512, with a difference that etching of the opening in operation 520 is performed before forming word lines. As illustrated in FIG. 4A, opening 372/374 are etched before sacrificial layer 310 are replaced by conductive layer 309.

Method 500' proceeds to operation 522, as illustrated in FIG. 5B, in which a TSC is formed extending vertically through the staircase structure by depositing a conductor layer in the opening. Operation 522 is similar to 514 in terms of forming the TSC. Unlike operation 514, in which word line contacts are formed simultaneously with TSCs, in operation 522, word line contacts are not formed because word lines are not yet formed prior to operation 522. Referring to FIG. 4B, TSCs 336 is formed before sacrificial layers 310 are replaced by conductive layer 309.

Method 500' proceeds to operation 524, as illustrated in FIG. 5B, in which word lines are formed by replacing the sacrificial layers in the dielectric stack with conductive layers. Operation 524 is similar to operation 510. Referring to FIG. 4C, word lines 309 are formed by replacing sacrificial layer 310 with conductive layer 309. Note that in FIG. 4C, TSC 336 and peripheral contact 348 have been formed.

Method 500' proceeds to operation 526, as illustrated in FIG. 5B, in which word line contacts are formed. Operation 526 is similar to operation 514 in terms of forming word lines. As illustrated in FIG. 4D, word line contacts 344 are formed after TSC 336, and peripheral contact 348 is formed.

FIG. 5C is a flowchart of a further exemplary method 500" for forming a 3D memory device, according to some embodiments of the present disclosure. Operations 502", 504", and 506" are similar to operations 502, 504, and 506, respectively, and thus are not repeated. Method 500" proceeds to operation 530, as illustrated in FIG. 5C, in which a dummy hole is formed extending vertically through the staircase structure. As shown in FIG. 3A, dummy hole 322 may be formed through one or more dielectric layers in staircase structure 342 using wet etching and/or dry etching, such as DRIE. In some embodiments, dummy hole 322 may extend vertically through all of the dielectric layers in staircase structure 342 and reach silicon substrate 202. In some embodiments, dummy hole 322 may extend into silicon substrate 202 (e.g., part of silicon substrate 202 may be etched away during the etching process).

In some embodiments, a dummy hole 324 outside dielectric stack 304 may be formed simultaneously (e.g., in the same fabrication steps) with forming dummy hole 322. Dummy hole 324 may be used to form a peripheral contact providing interconnect to a peripheral device 311. In some embodiments, dummy holes 322 and 324 may have a nominally circular shape in the plan view, as shown in FIG. 3A. In some embodiments, the size of dummy holes 322 and 324 may be nominally the same.

Method 500" proceeds to operation 532, as illustrated in FIG. 5C, in which a spacer having a hollow core is formed in the dummy hole. As shown in FIGS. 3B-3D, spacer 362 may be formed by depositing a dielectric layer 352 into dummy hole 322, followed by removing part of the dielectric layer 352 to form spacer 362, as described above in connection with operations 512 and 520. In some embodiments, spacer 362 may be formed directly by depositing dielectric layer 352 into dummy hole 322, without an additional etching operation to remove part of the deposited dielectric material to form spacer 362. Spacer 364 may be formed in a similar manner.

Method 500" proceeds to operation 534, as illustrated in FIG. 5C, in which a TSC is formed extending vertically through the staircase structure by depositing a conductor layer in the hollow core of the spacer. Operation 534 is similar to operation 522.

Method 500" proceeds to operation 536, as illustrated in FIG. 5C, in which word lines are formed by replacing the sacrificial layers in the dielectric stack with conductive layers. Operation 536 is similar to operation 524. Referring to FIG. 4C, word lines 309 are formed by replacing sacrificial layer 310 with conductive layer 309. Note that in FIG. 4C, TSC 336 and peripheral contact 348 have been formed.

Method 500" proceeds to operation 538, as illustrated in FIG. 5C, in which word line contacts are formed. Operation 538 is similar to operation 526. As illustrated in FIG. 4D, word line contacts 344 are formed after TSC 336, and peripheral contact 348 is formed.

According to one aspect of the present disclosure, a method for forming a 3D memory device is provided. A dielectric stack including a plurality of interleaved dielectric layers and sacrificial layers is formed on a substrate. A staircase structure is formed on one side of the dielectric stack. A dummy hole extending vertically through the staircase structure and reaching the substrate is formed. A spacer having a hollow core is formed in the dummy hole. A TSC in contact with the substrate is formed by depositing a conductor layer in the hollow core of the spacer. The TSC extends vertically through the staircase structure.

In some embodiments, prior to forming the spacer, a plurality of word lines are formed by replacing the sacrificial layers in the dielectric stack with conductive layers.

In some embodiments, a plurality of word line contacts each in contact with a respective one of the word lines are formed simultaneously with forming the TSC.

In some embodiments, after forming the TSC, a plurality of word lines are formed by replacing the sacrificial layers in the dielectric stack with conductive layers.

In some embodiments, a plurality of word line contacts each in contact with a respective one of the word lines are formed.

In some embodiments, to form the spacer, a dielectric layer is formed in the dummy hole.

In some embodiments, the dielectric layer includes silicon oxide.

In some embodiments, the dielectric layer forms the spacer.

In some embodiments, to form the spacer, the hollow core is etched through the dielectric layer deposited in the dummy hole.

In some embodiments, a second dummy hole outside the dielectric stack is formed simultaneously with the dummy hole.

In some embodiments, a peripheral contact is formed by depositing a second conductor layer in the second dummy hole simultaneously with forming the TSC. The peripheral contact is in contact with the substrate.

In some embodiments, the first and second conductor layers include the same material.

In some embodiments, the TSC has a nominally circular shape in a plan view.

In some embodiments, the conductor layer includes tungsten (W).

In some embodiments, the dielectric layers in the interleaved dielectric layers and sacrificial layers include silicon oxide, and the sacrificial layers in the interleaved dielectric layers and sacrificial layers include silicon nitride.

According to another aspect of the present disclosure, a method for forming a 3D memory device is provided. A dielectric stack including a plurality of interleaved dielectric layers and sacrificial layers is formed on a substrate. A staircase structure is formed on one side of the dielectric stack. A dummy channel structure reaching the substrate is formed. The dummy channel structure extends vertically through the staircase structure. A spacer is formed by removing part of the dummy channel structure. The spacer has a hollow core. A TSC in contact with the substrate is formed by depositing a conductor layer in the hollow core of the spacer. The TSC extends vertically through the staircase structure.

In some embodiments, prior to forming the spacer, a plurality of word lines are formed by replacing the sacrificial layers in the dielectric stack with conductive layers.

In some embodiments, a plurality of word line contacts each in contact with a respective one of the word lines are formed simultaneously with forming the TSC.

In some embodiments, after forming the TSC, a plurality of word lines are formed by replacing the sacrificial layers in the dielectric stack with conductive layers.

In some embodiments, a plurality of word line contacts each in contact with a respective one of the word lines are formed.

In some embodiments, prior to forming the dummy channel structure, a dummy hole extending vertically through the staircase structure and exposing part of the substrate is formed.

In some embodiments, to form the dummy channel structure, a dielectric layer is deposited in the dummy hole.

In some embodiments, the dielectric layer includes silicon oxide.

In some embodiments, to form the spacer, an opening is etched through the dielectric layer deposited in the dummy hole.

In some embodiments, to form the spacer, part of the dielectric layer deposited in the dummy hole is removed.

In some embodiments, a second spacer outside the dielectric stack is formed simultaneously with the spacer.

In some embodiments, a peripheral contact is formed by depositing a second conductor layer in the second spacer simultaneously with forming the TSC. The peripheral contact is in contact with the substrate.

In some embodiments, the first and second conductor layers include the same material.

In some embodiments, the spacer and the second space have a nominally same thickness.

In some embodiments, the conductor layer includes tungsten (W).

In some embodiments, the dielectric layers in the interleaved dielectric layers and sacrificial layers include silicon oxide, and the sacrificial layers in the interleaved dielectric layers and sacrificial layers include silicon nitride.

According to yet another aspect of the present disclosure, a 3D memory device is provided. The 3D memory device includes a substrate, a memory stack on the substrate including a plurality of interleaved conductive layers and dielectric layers, a staircase structure on one side of the memory stack, and a TSC extending vertically through the staircase structure of the memory stack. The TSC is in contact with the substrate.

In some embodiments, the 3D memory device further includes a peripheral contact outside of the memory stack. The peripheral contact is in contact with the substrate.

In some embodiments, the peripheral contact and the TSC include the same material.

In some embodiments, a sidewall of each of the TSC and peripheral contact is surrounded by a spacer with a nominally same thickness.

In some embodiments, the spacer includes silicon oxide.

In some embodiments, the 3D memory device further includes a plurality of word line contacts each in contact with a respective one of the conductive layers in the staircase structure.

The foregoing description of the specific embodiments will so reveal the general nature of the present disclosure that others can, by applying knowledge within the skill of the art, readily modify and/or adapt for various applications such specific embodiments, without undue experimentation, without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A three-dimensional (3D) memory device, comprising:
   a memory stack comprising a plurality of interleaved conductive layers and dielectric layers, wherein edges of the interleaved conductive layers and dielectric layers define a staircase structure on a side of the memory stack; and
   a through stair contact (TSC) extending vertically through the staircase structure of the memory stack, wherein the TSC comprises a conductor layer and a spacer circumscribing the conductor layer, and the conductor layer of the TSC is isolated from all of the plurality of conductive layers of the memory stack by the spacer.

2. The 3D memory device of claim 1, wherein the conductive layers of the memory stack comprise polysilicon, and the dielectric layers of the memory stack comprise silicon oxide.

3. The 3D memory device of claim 1, wherein the conductor layer of the TSC comprises a metal.

4. The 3D memory device of claim 1, wherein the spacer of the TSC has a uniform thickness.

5. The 3D memory device of claim 1, further comprising a channel structure extending vertically through an inner region of the memory stack, wherein the staircase structure is disposed in an outer region of the memory stack.

6. The 3D memory device of claim 5, wherein the TSC is disposed inside the outer region of the memory stack.

7. The 3D memory device of claim 5, wherein the TSC extends vertically through a smaller number of the conductive layers and dielectric layers of the memory stack than the channel structure.

8. The 3D memory device of claim 1, wherein a cross-section of the TSC has a circular shape.

9. The 3D memory device of claim 1, further comprising a peripheral device above or below the memory stack.

10. The 3D memory device of claim 9, further comprising a first substrate on which the memory stack is formed, and a second substrate on which the peripheral device is formed.

11. The 3D memory device of claim 10, further comprising an interlayer dielectric (ILD) layer between the first substrate and the memory stack.

12. The 3D memory device of claim 10, wherein the first substrate comprises silicon, and the TSC is in contact with the first substrate.

13. The 3D memory device of claim 1, further comprising a peripheral contact outside of the memory stack, wherein the peripheral contact comprises a conductor layer and a spacer circumscribing the conductor layer.

14. The 3D memory device of claim 1, further comprising a word line contact in contact with one of the conductive layers of the memory stack at the staircase structure.

15. The 3D memory device of claim 14, wherein a cross-section of the word line contact and a cross-section of the TSC have a same shape.

16. A three-dimensional (3D) memory device, comprising:
    a memory stack comprising a plurality of interleaved conductive layers and dielectric layers, wherein an edge of the memory stack comprises a staircase structure comprising a plurality of stairs, each stair comprises a landing area of a corresponding conductive layer that is uncovered by an adjacent conductive layer above the corresponding conductive layer; and
    a through stair contact (TSC) extending vertically through a first landing area and a lower portion the staircase structure below the first landing area, wherein the TSC comprises a vertical conductor structure and a spacer laterally surrounding the vertical conductor structure, and the vertical conductor structure is isolated from a first conductive layer corresponding to the first landing area by the spacer.

17. The 3D memory device of claim 16, further comprising:
    a word line contact extending vertically and in contact with a second landing area without penetrating the staircase structure.

18. The 3D memory device of claim 17, wherein:
    the word line contact and the vertical conductor structure of the TSC comprise a same conductive material.

19. The 3D memory device of claim 17, wherein:
    a lateral dimension of the word line contact is less than a lateral dimension of the vertical conductor structure of the TSC.

20. The 3D memory device of claim 15, wherein:
    a lateral dimension of the word line contact is less than a lateral dimension of the TSC.

* * * * *